(12) United States Patent
Sakai et al.

(10) Patent No.: US 7,186,604 B2
(45) Date of Patent: Mar. 6, 2007

(54) SEMICONDUCTOR INTEGRATED CIRCUIT DEVICE AND METHOD FOR FABRICATING THE SAME

(75) Inventors: Satoshi Sakai, Yokohama (JP); Satoshi Yamamoto, Takarazuka (JP); Atsushi Hiraiwa, Higashimurayama (JP); Ryoichi Furukawa, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/519,799

(22) PCT Filed: Aug. 15, 2002

(86) PCT No.: PCT/JP02/08284

§ 371 (c)(1),
(2), (4) Date: Dec. 2, 2005

(87) PCT Pub. No.: WO2004/017418

PCT Pub. Date: Feb. 26, 2004

(65) Prior Publication Data

US 2006/0121740 A1  Jun. 8, 2006

(51) Int. Cl.
*H01L 21/8238* (2006.01)
(52) U.S. Cl. ............... 438/197; 438/240; 438/287; 438/733; 438/630; 257/E21.263
(58) Field of Classification Search ............... 438/200, 438/199, 287, 289, 301, 630, 649, 197, 240, 438/733
See application file for complete search history.

(56) References Cited

U.S. PATENT DOCUMENTS 6,008,095 A * 12/1999 Gardner et al. ............. 438/296
6,639,284 B1 * 10/2003 Chatterjee et al. .......... 257/355
6,989,322 B2 * 1/2006 Gluschenkov et al. ...... 438/585
2001/0028093 A1 * 10/2001 Yamazaki et al. .......... 257/412
2002/0047170 A1 * 4/2002 Ota ............................. 257/410
2002/0052086 A1 * 5/2002 Maeda ........................ 438/283
2003/0092233 A1   5/2003 Furukawa et al.
2003/0096501 A1   5/2003 Ootsuka et al.
2005/0287730 A1 * 12/2005 Snyder et al. .............. 438/200

FOREIGN PATENT DOCUMENTS

| JP | 2000-022007 | 1/2000 |
| JP | 2003-0092233 A1 | 5/2003 |
| JP | 2003-158195 A | 5/2003 |
| WO | WO 03/049188 A1 | 6/2003 |

* cited by examiner

*Primary Examiner*—Asok K. Sarkar
*Assistant Examiner*—Victor V. Yevsikov
(74) *Attorney, Agent, or Firm*—Mattingly, Stanger, Malur & Brundidge, P.C.

(57) ABSTRACT

After forming a silicon oxide film 9 on the surface of a region A of a semiconductor substrate 1, a high dielectric constant insulating film 10, a silicon film, a silicon oxide film 14 are successively deposited over the semiconductor substrate 1, and they are patterned to leave the silicon oxide film 14 in regions for forming gate electrodes. Then, after fabricating silicon films 13n and 13p by using the patterned silicon oxide film 14 as a mask, when removing the silicon oxide film 14, etching is performed under the condition where the etching selectivity of the silicon oxide film 14 to the high dielectric constant insulating film 10 becomes large, thereby leaving the high dielectric constant insulating film 10 also to portions below the end of the gate electrodes (13n, 13p). Thus, it is possible to ensure the voltage withstanding thereof and improve the characteristics of MISFET.

17 Claims, 45 Drawing Sheets

*Fig.2*
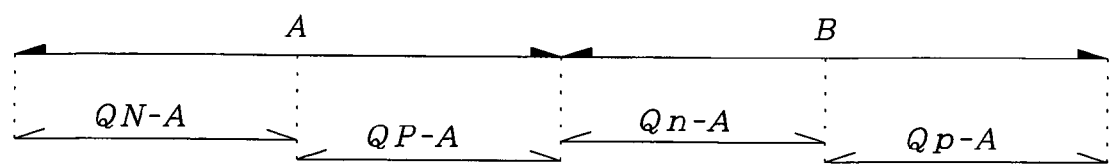
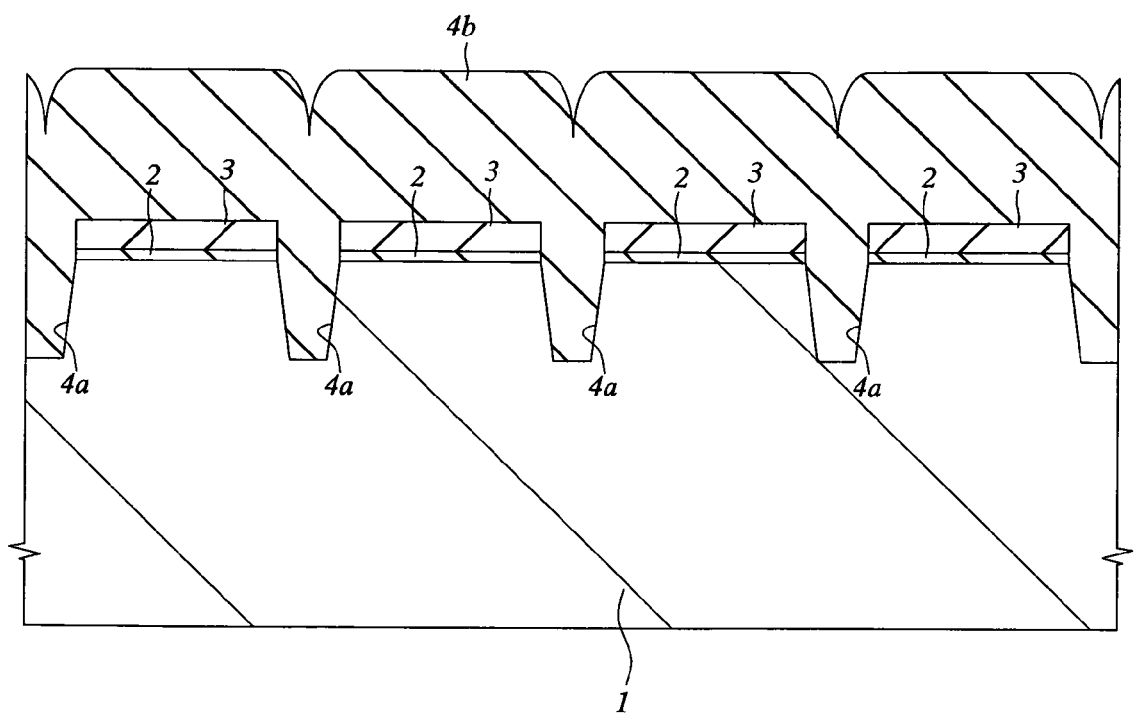

Fig.10
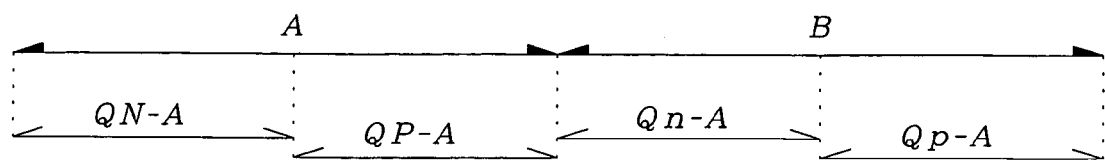
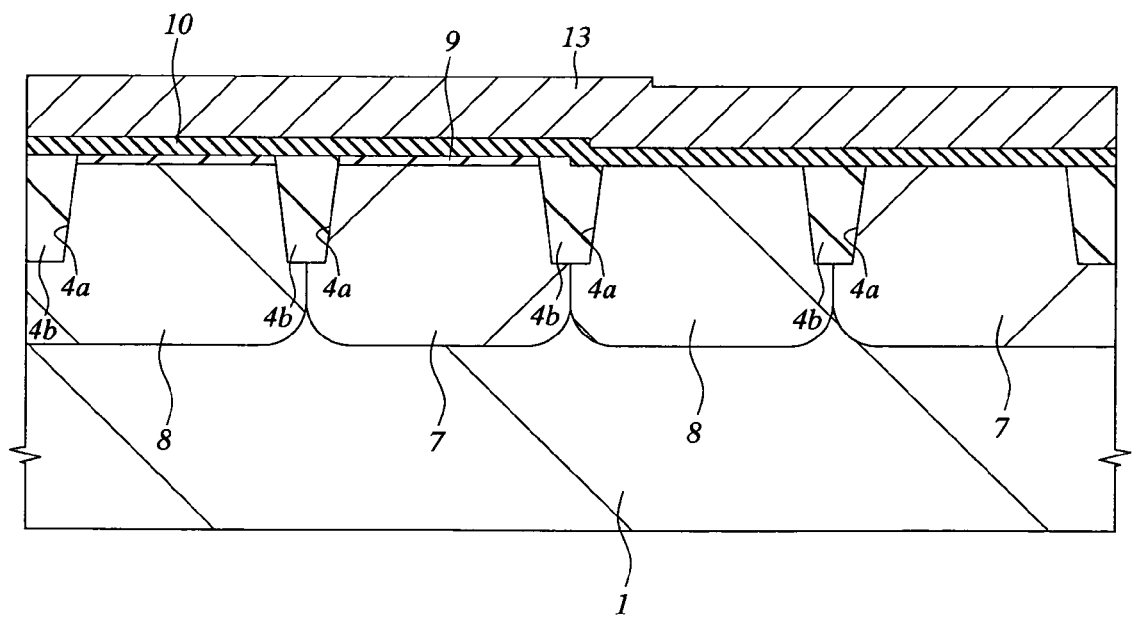

Fig.19
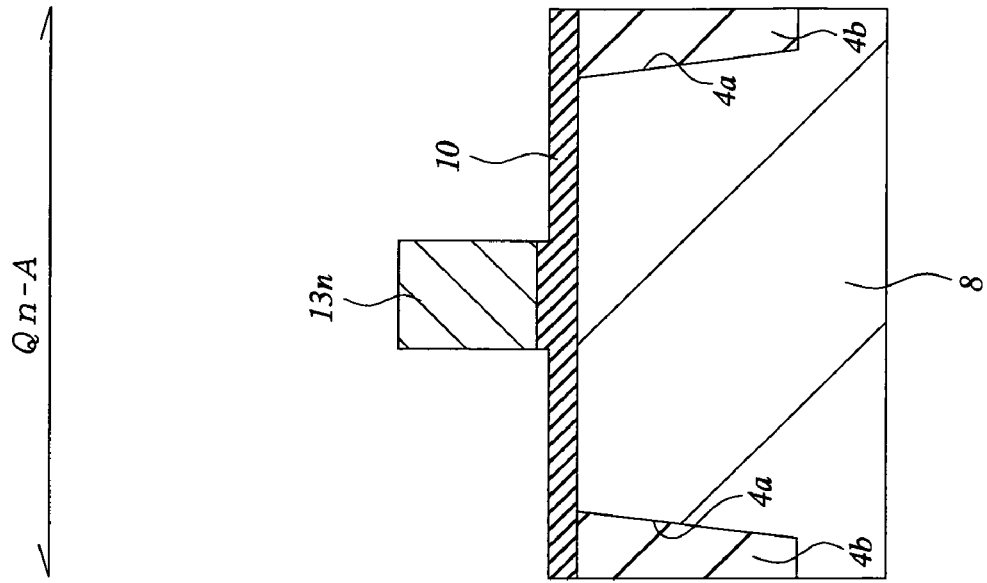
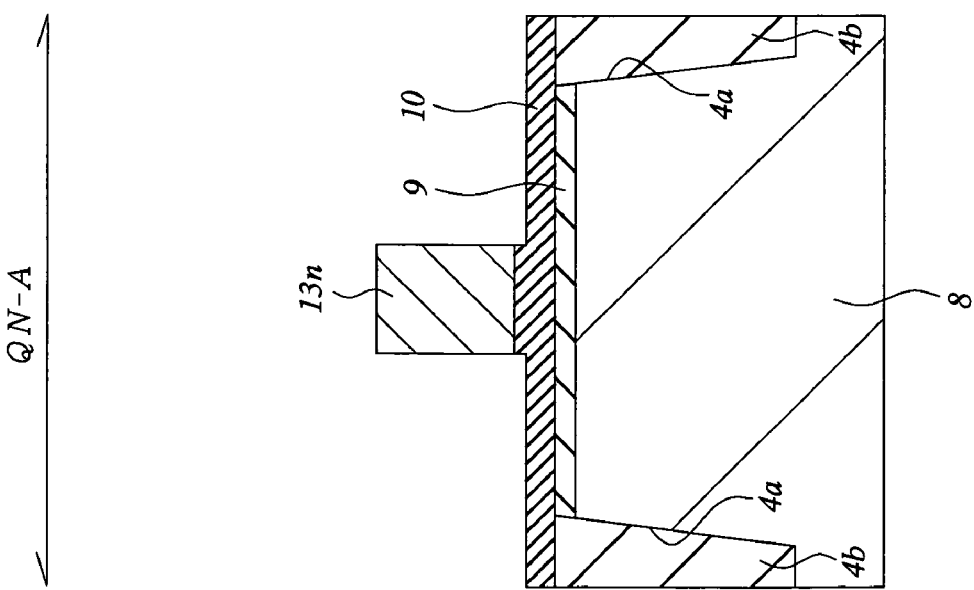

Fig.25
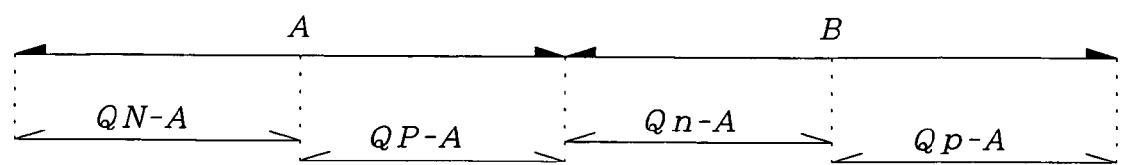
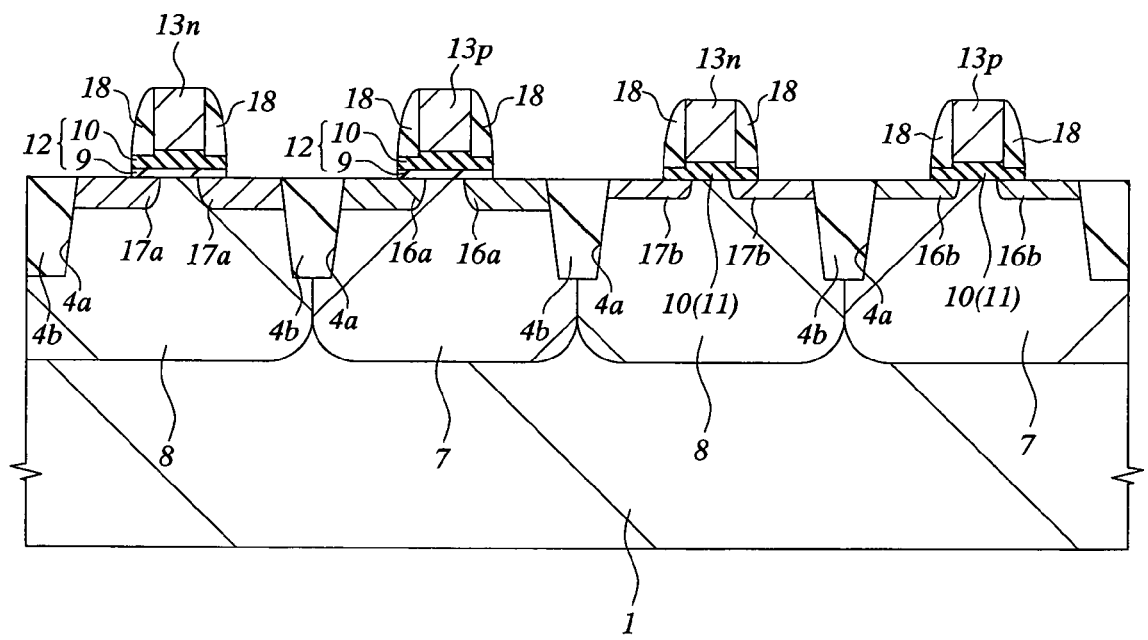

SEMICONDUCTOR INTEGRATED CIRCUIT DEVICE AND METHOD FOR FABRICATING THE SAME

TECHNICAL FIELD

This invention concerns a semiconductor integrated circuit device and a method of producing thereof and, more in particular, it relates to a technique which is effective to application to a semiconductor integrated circuit device having MISFET (Metal Insulator Semiconductor Field Effect Transistor) using a high dielectric constant insulating film for a gate insulating film.

BACKGROUND ART

MISFET (Metal Insulator Semiconductor Field Effect Transistor) used, for example, in logic circuits or memories has a gate insulating film comprising a silicon oxide film formed by thermally oxidizing a silicon substrate and a gate electrode formed thereon.

Along with size-reduction and lowering of a driving voltage for semiconductor integrated circuit devices, thickness of gate insulating films for MISFET has also tends to be decreased.

However, since the decrease of the film thickness is limited, use of a high dielectric constant insulating film (high-K film) comprising a metal oxide such as $Al_2O_3$ (aluminum oxide, alumina) has been studied.

For example, Japanese Published Unexamined Patent Application No. 2000-22007 describes a semiconductor device in which the gate insulating film is comprised of a high dielectric constant insulating film.

The present inventors are under research and development of semiconductor integrated circuit devices and under study on high dielectric constant insulating films for the gate insulating film of MISFET.

However, in MISFET used for logic circuits or memories such as SRAM (Static Random Access Memory), in view of lowering for the resistance of the gate electrode and source and drain regions formed on both sides of the gate electrode, a silicide layer is formed on the regions.

Further, for fabricating the gate electrode at a high accuracy, it has been adopted for a method of patterning an insulating film (for example, silicon oxide film) on a conductive film to form a gate electrode and then fabricating the gate electrode by using such an insulating film as a mask.

Then, the insulating film used as the mask is removed for silicidation described above, but a gate insulating film on both ends of the gate electrode is also scraped and oxidation for repairing gate edge is necessary for compensating the same.

However, as will be described specifically, when the oxidation for repairing gate edge is applied in a case of using the high dielectric constant insulating film for the gate insulating film, since a silicon oxide film is formed on both ends of the gate electrode, various disadvantages may be caused such as lowering of the capacitance at the end of the gate electrode and degradation of the film quality of the high dielectric constant insulating film itself.

This invention intends to improve the characteristics of a semiconductor integrated circuit device having MISFET using a high dielectric constant insulating film for a gate insulating film.

Further, this invention intends to provide a more preferred production method by using a high dielectric constant insulating film for a semiconductor integrated circuit having MISFET using a gate insulating film.

The foregoing and other objects and novel features of the invention will be apparent by reading the description of the present specification and the appended drawings.

DISCLOSURE OF THE INVENTION

Outline for the typical inventions among those disclosed in the present application will be described simply as below.

A method of producing a semiconductor integrated circuit device according to this invention comprises the steps of forming a high dielectric constant insulating film, a conductive film and an insulating film successively over a semiconductor substrate, selectively removing the insulating film thereby forming a predetermined pattern, etching the conductive film by using the insulating film having the predetermined pattern as a mask thereby forming a conductor piece, then removing the insulating film to expose the upper surface of the conductor piece in which the insulating film is removed to expose the upper surface of the conductor piece in a state of leaving the high dielectric constant film on both sides of the conductor piece above the semiconductor substrate, and then depositing a metal film on the conductor piece and forming a reaction layer at a portion of contact between the conductor piece and the metal film.

A semiconductor integrated circuit device according to this invention comprises MISFET having (a) a conductor piece formed via a high dielectric constant insulating film over a semiconductor substrate and (b) a semiconductor region formed in a semiconductor substrate on both sides of the conductor pieces, in which (c) the high dielectric constant insulating film extends as far as a portion below the end of the conductor piece.

The conductor piece is, for example, a silicon film and may have a silicide film on the silicon film.

BRIEF DESCRIPTION OF THE DRAWINGS

FIG. 1 to FIG. 33 are cross sectional views for a main portion of a substrate illustrating a method of producing a semiconductor integrated circuit device as the first embodiment according to the invention;

Figure 1:
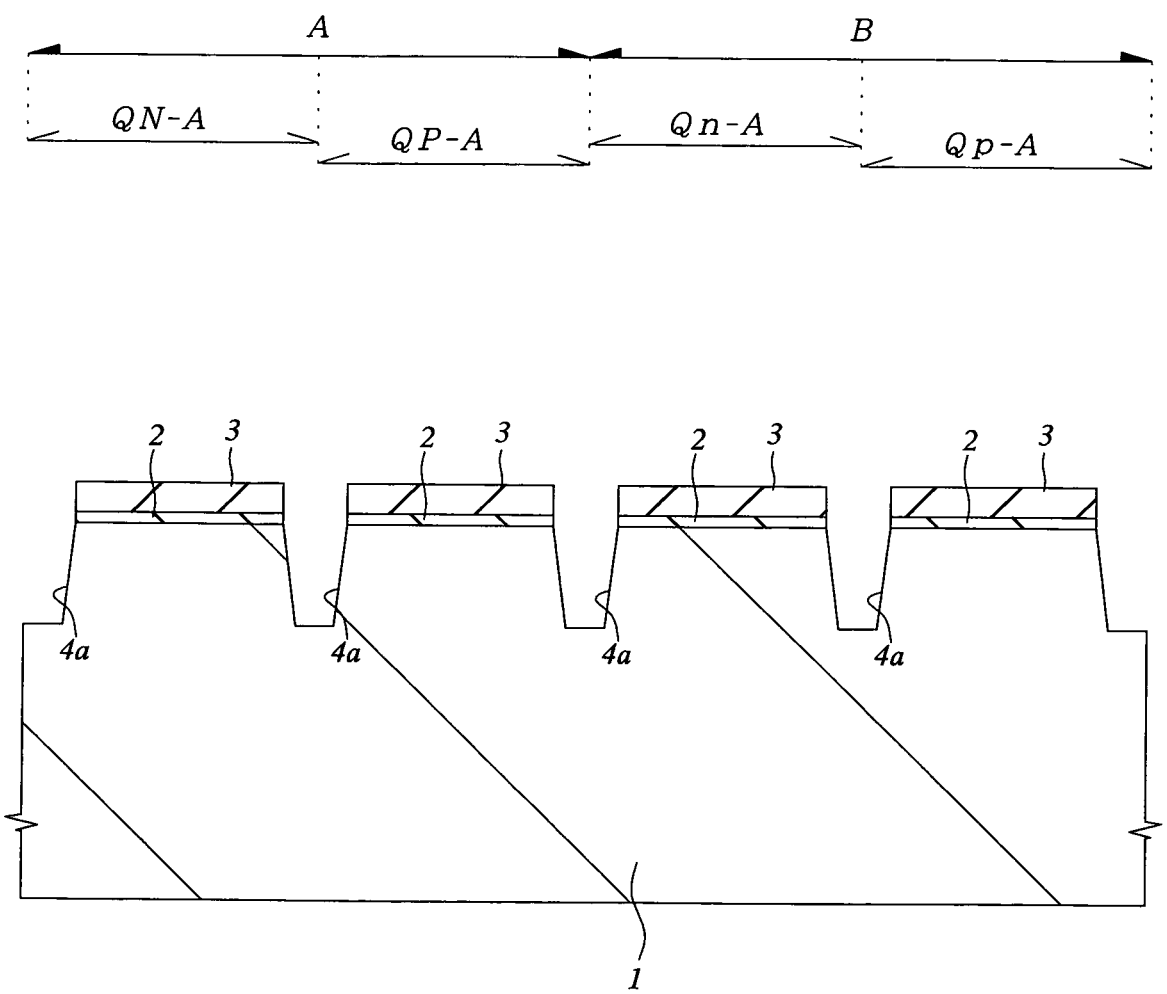

BEST MODE FOR PRACTICING THE INVENTION (First Embodiment)

Preferred embodiments of the invention will be described specifically with reference to the drawings. Throughout the drawings for explaining the preferred embodiment, those components having identical functions carry the same numerals, for which duplicated explanations will be omitted.

A method of producing a semiconductor integrated circuit device as the first embodiment according to this invention is to be described with reference to the cross sectional views for a main portion of a semiconductor substrate shown in FIG. 1 to FIG. 33 in the sequence of steps. In the drawings, a region A is a region in which a gate insulating film of a large effective thickness is formed and a region B is a region in which a gate insulating film of a small effective thickness is formed. Further, in the region A, are present a region QN-A in which an n-channel type MISFET (hereinafter referred to as "nMIS") QN is formed and a region QP-A in which a p-channel type MISFET (hereinafter referred to as "pMIS") Qp is formed. Further, in the region B, are present a region Qn-A in which an n-channel MISFET QN is formed and a region Qp-A in which a p-channel MISFET Qp is formed. Further, the regions QN-A and Qn-A are referred to as the nMIS-forming region and the regions QP-A and Qp-A are referred to as the pMIS-forming region. That is, four types of MISFET are formed on one identical substrate. In addition, various MISFETs of different threshold voltages (Vth) may be formed in the region A and the region B.

At first, as shown in FIG. 1, a semiconductor substrate 1 comprising, for example, p-type silicon single crystal is provided. Then, the semiconductor substrate is thermally oxidized to form a thin silicon oxide film 2 of about 0.01 μm thickness on the surface thereof and then a silicon nitride film 3 of about 0.1 μm thickness is deposited as an upper layer thereof by a CVD (Chemical Vapor Deposition) method.

Then, a not illustrated resist pattern is formed on the silicon nitride film 3 in the device forming region of the semiconductor substrate 1, and the silicon nitride film 3 is etched by using the resist pattern as a mask. As a result, the silicon nitride film 3 on the device isolation region of the semiconductor substrate 1 is removed.

Then, the silicon oxide film 2 and the semiconductor substrate 1 are dry-etched successively by using the patterned silicon nitride film 3 as a mask, thereby forming device isolation trenches 4a each of about 0.35 μm depth to the semiconductor substrate 1 in the device isolation region.

Then, as shown in FIG. 2, a thermal oxidation treatment is applied to the semiconductor substrate 1 to form a thin silicon oxide film (not illustrated) on the surface of the device isolation trenches 4a and then a silicon oxide film 4b is deposited on the semiconductor substrate 1 by a CVD method.

Figure 3:
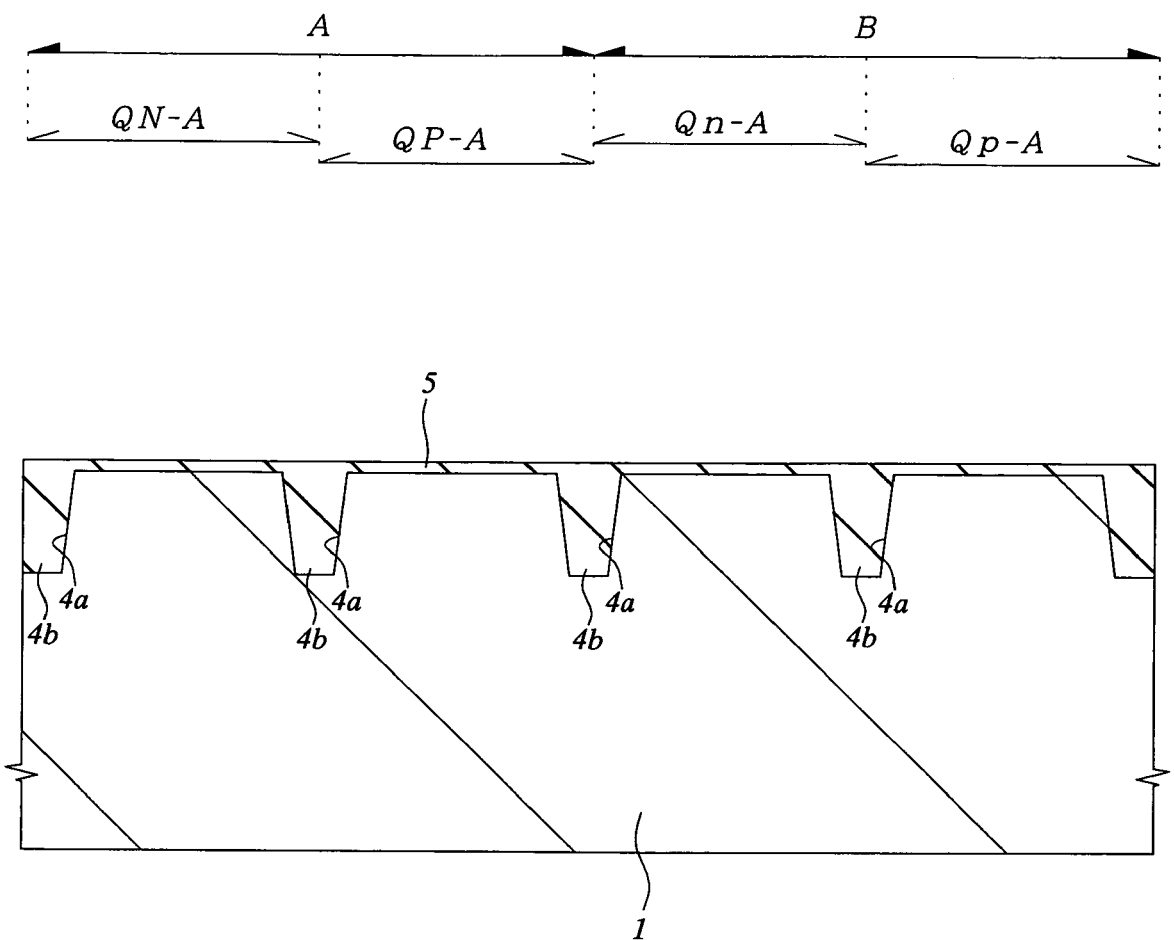

Then, the surface of the silicon oxide film 4b is polished by a CMP (Chemical Mechanical Polishing) method while leaving the silicon oxide film 4b in the inside of the device isolation trenches 4a to form device isolation as shown in FIG. 3. Then, a heat treatment at about 1000° C. is applied to the semiconductor substrate 1 to shrink fit the silicon oxide film 4b buried in the device isolation trenches 4a. The device isolation isolates the region A and the region B, the region QN-A and the region QP-A, and the region Qn-A and the region Qp-A.

After removing the silicon nitride film 3 by using hot phosphoric acid and successively removing the silicon oxide film 2 on the surface of the semiconductor substrate 1 by using an aqueous hydrofluoric acid solution, the semiconductor substrate 1 is thermally oxidized to form a protective film 5 of a silicon oxide film on the surface of the semiconductor substrate 1.

Figure 4:
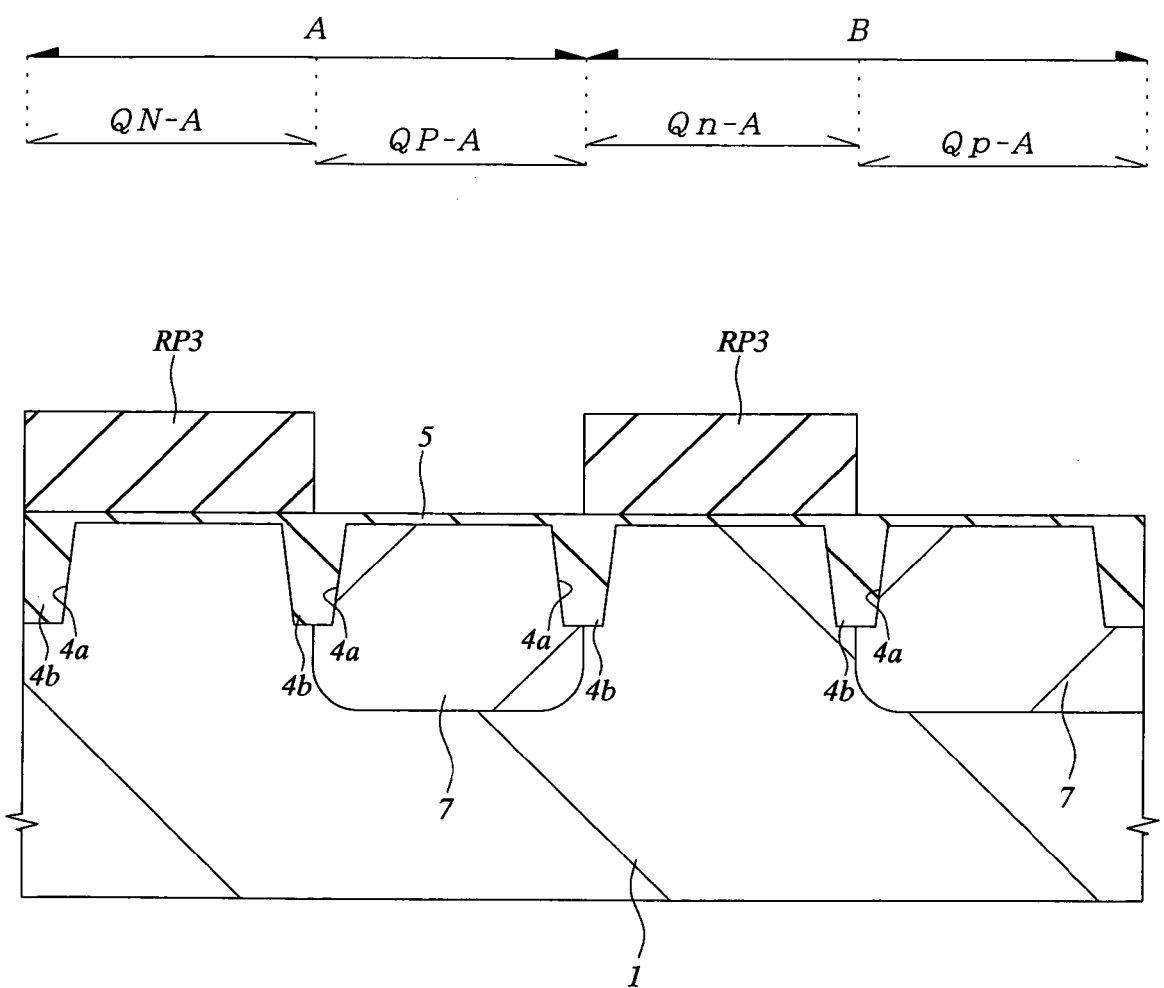

Then, as shown in FIG. 4, the nMIS-forming regions (QN-A, Qn-A) of the regions A and B are covered with a resist pattern RP3 and n-impurity, for example, phosphorus (P) is ion implanted in the pMIS-forming regions (QP-A, Qp-A) of the regions A and B to form n-wells 7. Phosphorus is implanted, for example, at an implantation energy of 500–100 KeV and at a dose of $5 \times 10^{11}$ to $5 \times 10^{12}$ cm$^{-2}$, and retrograde wells are formed by ion plantation continuously for about twice or three times while changing the energy.

Figure 5:
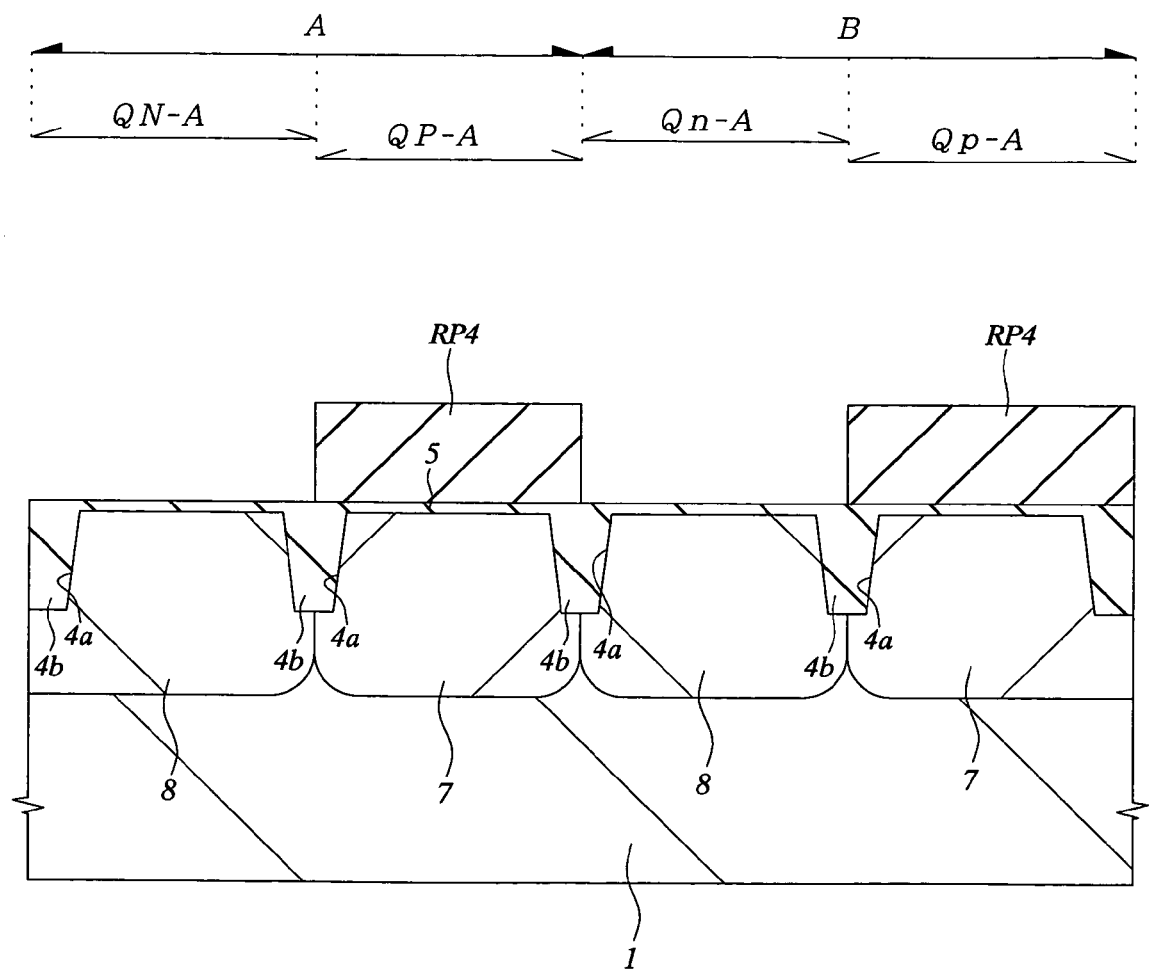

After removing the resist pattern RP3 shown in FIG. 5, pMIS-forming regions (QP-A, Qp-A) of the regions A and B are covered with a resist pattern RP4, and p-impurity, for example, boron (B) or boron fluoride (BF$_2$) is ion implanted to the nMIS-forming regions (QA-A, Qn-A) of the regions A and B to form p-wells 8. Boron or boron fluoride is implanted, for example, at an implantation energy of 500–100 KeV and at a dose of $5 \times 10^{11}$ to $5 \times 10^{12}$ cm$^{-2}$ and, retrograde wells are formed by ion plantation continuously for about twice or three times while changing the energy.

Then, after removing the resist pattern RP4, an impurity for adjusting the threshold voltage Vth of MISFET is ion implanted to each of the channel regions for the n-wells 7 and p-wells 8 (channel implantation). Ion implantation to the channel region is conducted, for example, as shown below.

Figure 6:
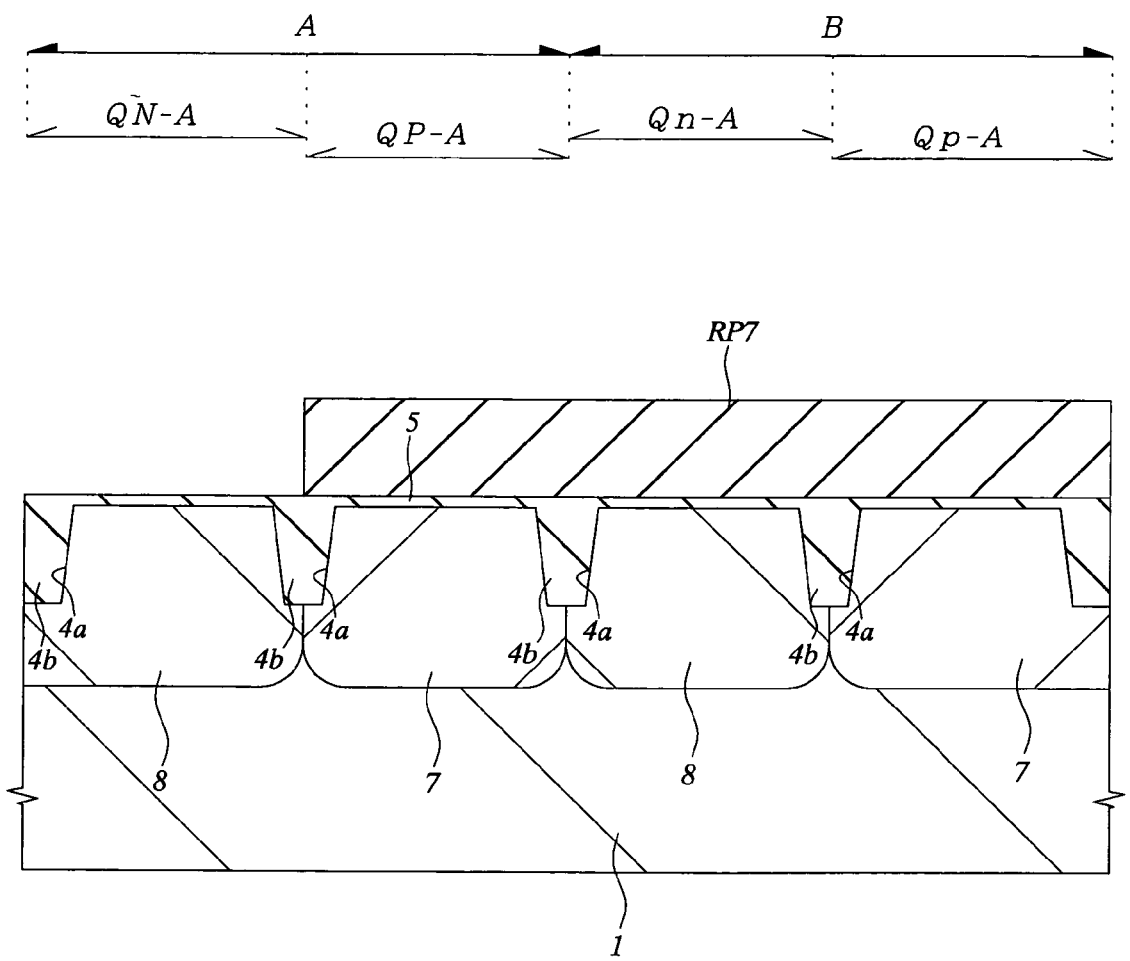

At first, as shown in FIG. 6, p-impurity, for example, boron fluoride is ion implanted to the channel region of the nMIS-forming region (QN-A) by using a resist pattern RP7 having an opening for the nMIS-forming region (QN-A) as a mask. Boron fluoride is implanted, for example, at an implantation energy of 25 KeV and at a dose of $8 \times 10^{12}$ cm$^{-2}$.

Then, the impurity is implanted also to the pMIS-forming region (QP-A) in the same manner. That is, n-impurity for example, phosphorus is ion implanted by using a resist pattern (not illustrated) having an opening for the pMIS-forming region (QP-A) as a mask. Phosphorus is implanted, for example, at an implantation energy of 20 KeV and at a dose of $1.1 \times 10^{13}$ cm$^{-2}$. Impurities are implanted properly also for other MIS-forming regions (such as Qn-A, Qp-A) depending on the threshold values of MISFET formed in such regions.

Figure 7:
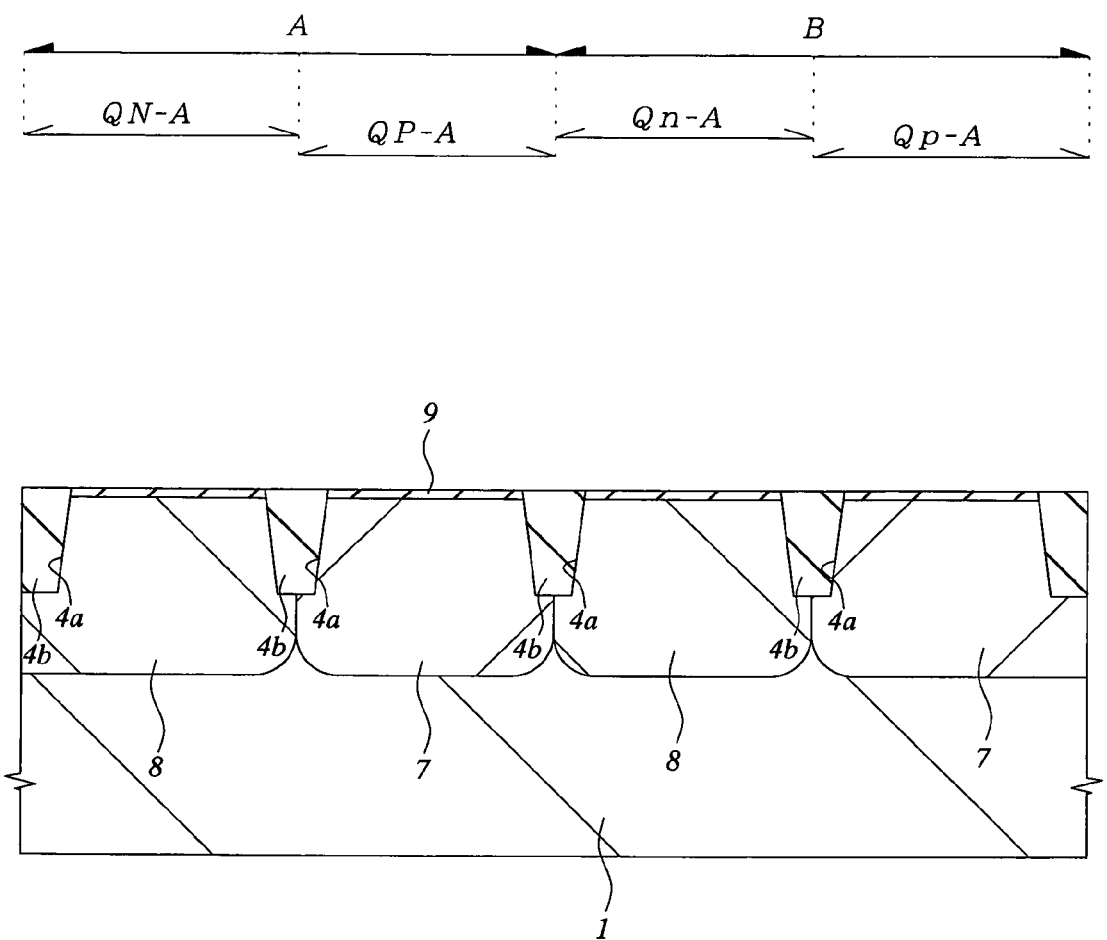

After removing the resist pattern used as the mask upon channel implantation, the protective film 5 is removed, and a silicon oxide film 9 is formed to a thickness of, for example, about 4 to 5 nm on the surface of the semiconductor substrate 1 as shown in FIG. 7. The silicon oxide film 9 can be formed, for example, by a thermal CVD method or a thermal oxidation method. Alternatively, the silicon oxide film 9 may be formed into a silicon oxynitride film by applying a hot nitriding treatment to the semiconductor substrate 1. The thermal nitriding treatment is applied, for example, by keeping a semiconductor substrate 1 heated to about 900° C. in a reduced pressure atmosphere containing nitrogen which is transformed into radicals by plasma discharge.

Figure 8:
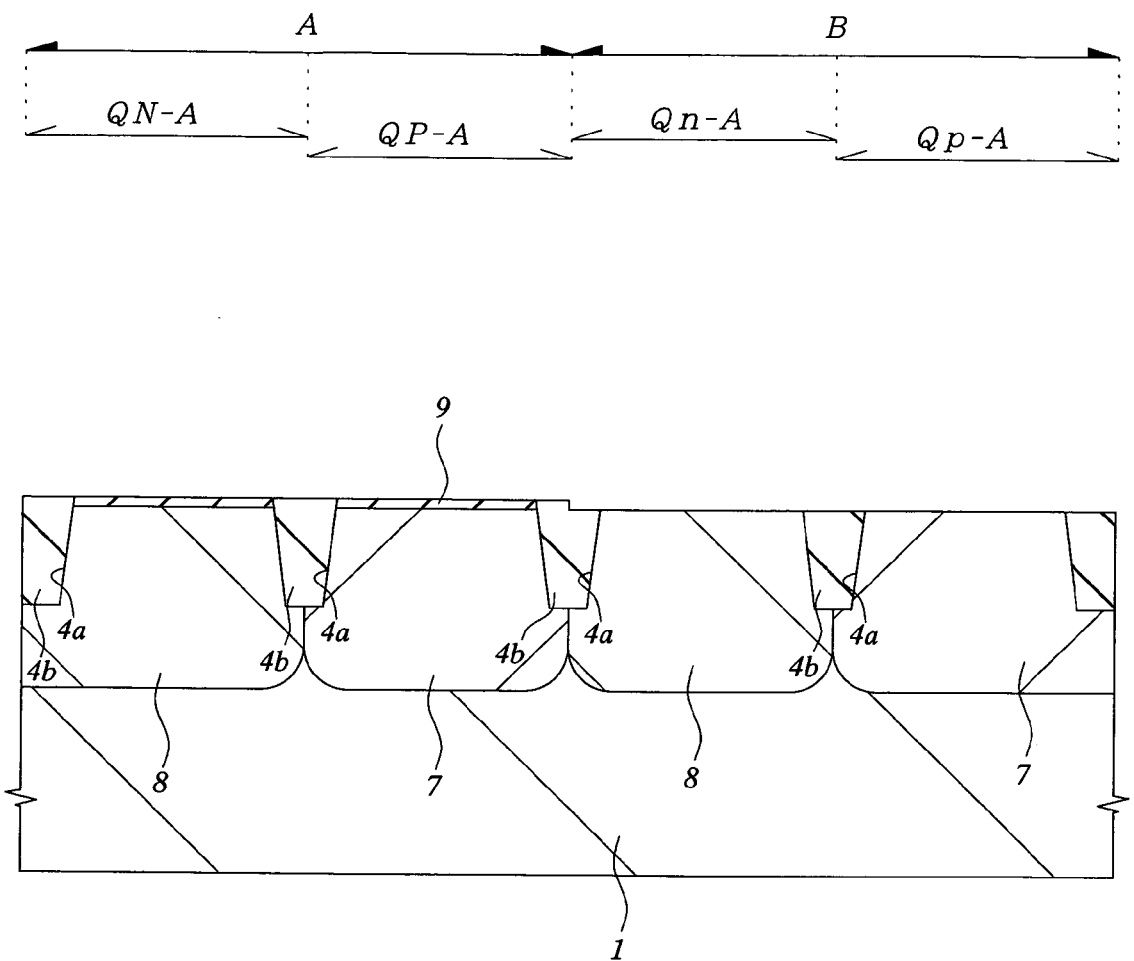

Next, as shown in FIG. 8, after covering the region A with a resist pattern (not illustrated), the silicon oxide film 9 in the region B is removed by using, for example, an aqueous phosphoric acid solution. Then, the resist pattern is removed.

Figure 9:
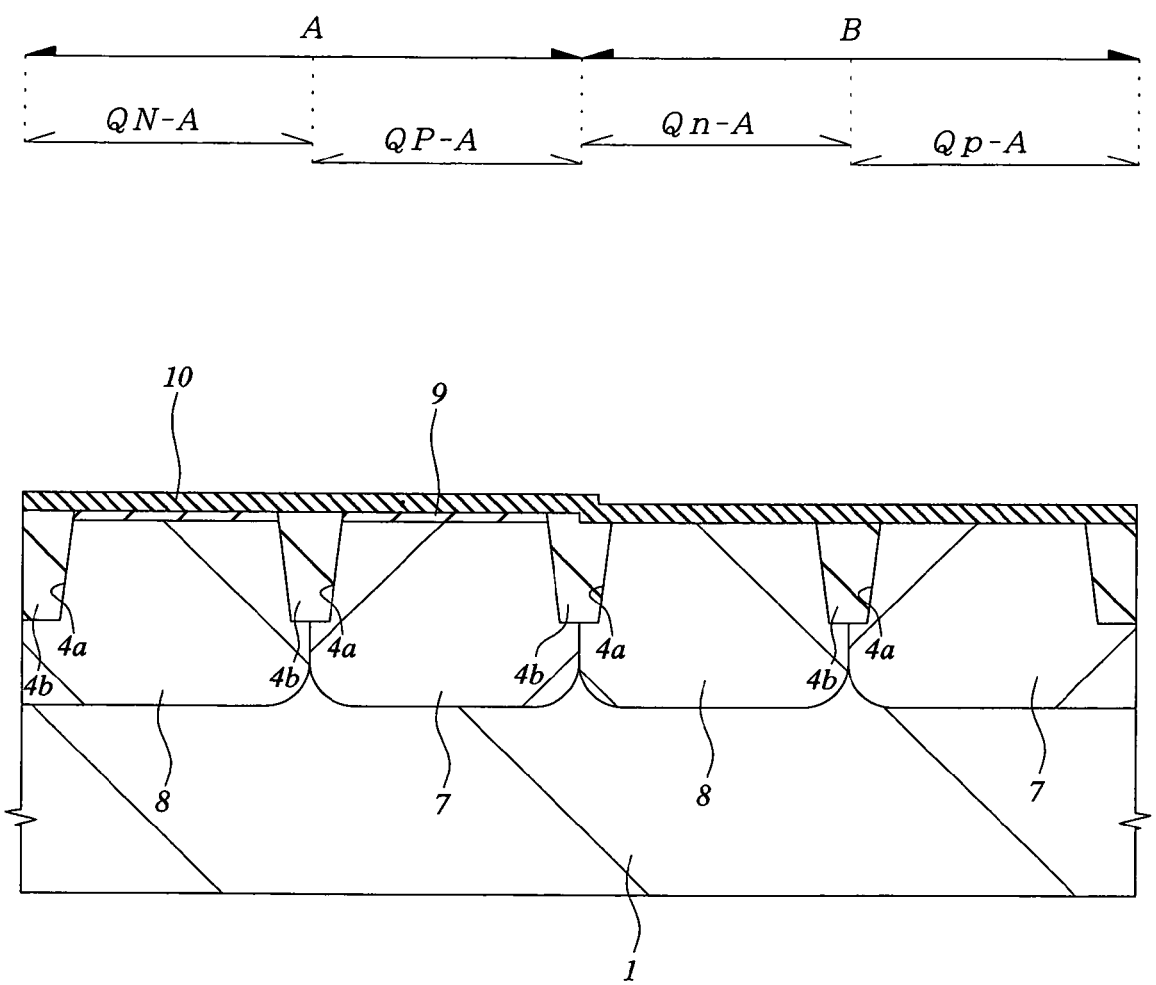

Next, as shown in FIG. 9, a high dielectric constant insulating film 10, for example, an alumina oxide film (Al$_x$O$_y$) is formed on the semiconductor substrate 1. The high dielectric constant insulating film 10 can be deposited by, for example, a sputtering method. For the high dielectric constant insulating film, there may be used, in addition to the alumina film, a titanium oxide film (TiO$_x$), zirconium oxide film (ZrO$_x$), hafnium oxide film (HfO$_x$), tantalum oxide film (TaO$_x$) or ruthenium oxide film (RuO$_x$), etc.

The high dielectric constant insulating film means herein those films having a specific high dielectric constant of 2.0 or more. Further, the high dielectric constant insulating film means thermally oxidized films such as a silicon oxide film or those films having a higher specific dielectric constant than the specific dielectric constant of a CVD oxide film such as a silicon oxide film 4b.

The thickness of the high dielectric constant insulating film 10 formed over the semiconductor substrate 1 is set so as to be about 1 nm of the equivalent oxide thickness, and it is deposited to about 10 nm in a case of, for example, an alumina plate while considering the specific dielectric constant. The high dielectric constant insulating film 10 forms a gate insulating film of MIS. That is, as will be described later, a gate insulating film (11) comprising a high dielectric constant insulating film 10 with an effective thickness of about 1 nm is formed in the region B, while a gate insulating film (12) comprising a laminate film of the high dielectric constant insulating film 10 and the silicon oxide film 9 having an equivalent oxide thickness of about 5 to 6 nm is formed in the region A.

As described above, by using the high dielectric constant insulating film 10 for the gate insulating film in the region B, the capacitance can be increased even when the thickness of the gate insulating film is made relatively large. Accordingly, it can cope with the formation of a fine MISFET with the width for the gate electrode of 0.1 μm or less.

Further, it is expected that the thickness of the gate insulating film of the fine MISFET is 1 nm or less when it is constituted only with a thermally oxidized film. However, when the thickness of the thermally oxidized film is 1 nm or less, a leak current exceeds 10 A/cm$^2$ to increase consumption current (for example, stand-by current).

Accordingly, by the use of the high dielectric constant insulating film for the gate insulating film, the consumption current can be reduced.

Further, MISFET with a relatively thick gate insulating film is formed in the region A. In the MISFET described above, the thickness of the gate insulating film is made relatively thick, for example, for the reduction of the consumption power, for holding stored information or for coping with the external power surface. Then, the gate insulating film (12) comprising the laminate film of the high dielectric constant insulating film 10 and the silicon oxide film 9 is formed.

Particularly, in the region B, before forming the high dielectric constant insulating film 10 over the semiconductor substrate 1, a silicon oxide film, a silicon nitride film or a silicon oxynitride film of 1 nm or less may be formed for stabilizing the boundary with the semiconductor substrate 1.

Next, as shown in FIG. 10, a silicon film (conductive film) 13 of a thickness of, for example, about 200 nm is deposited over the semiconductor substrate 1 by a CVD method.

Figure 11:
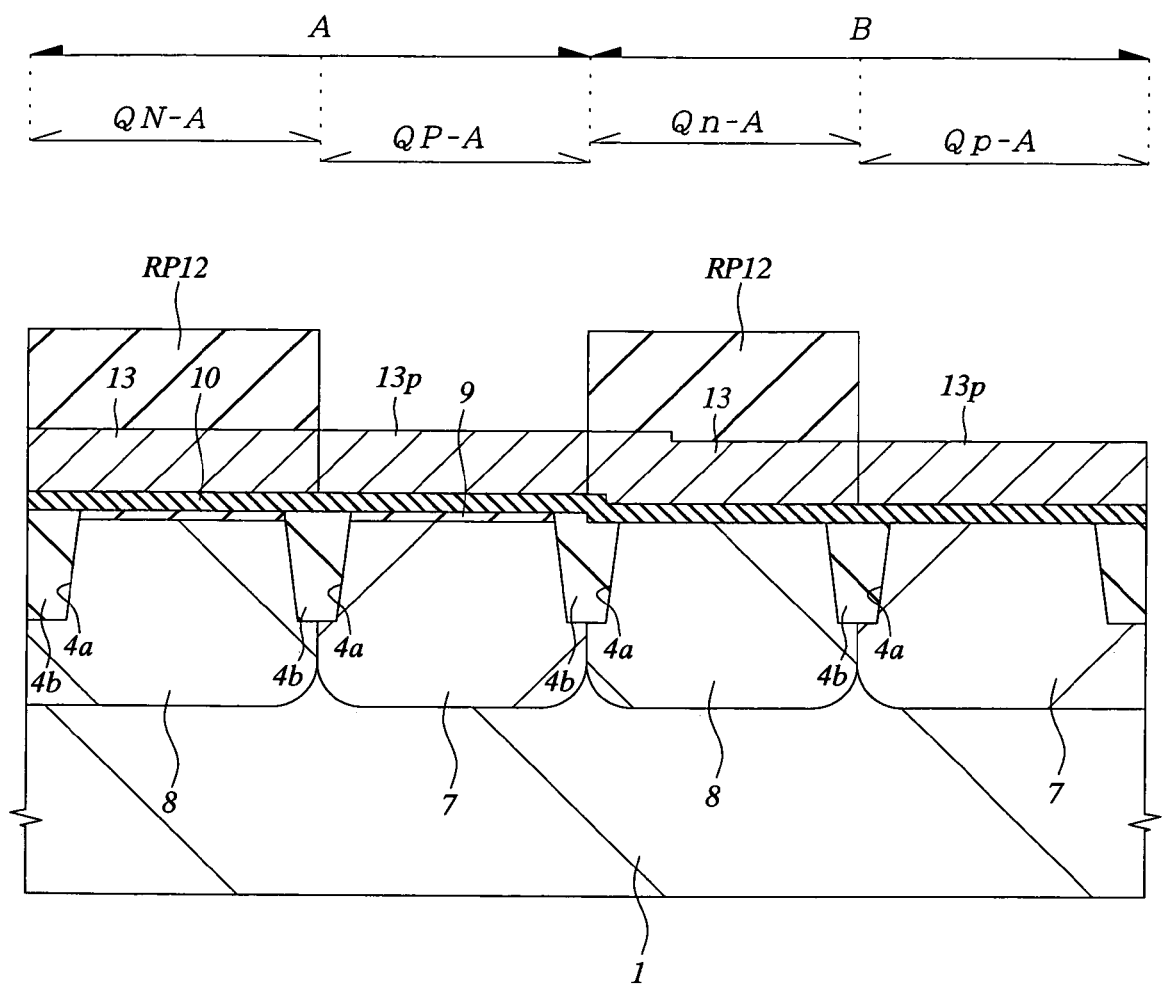

Next, as shown in FIG. 11, after forming a resist pattern RP12 for the nMIS-forming region (QN-A and Qn-A) in the regions A and B, p-impurity, for example, boron is ion implanted (13p) by using the resist pattern RP12 as a mask.

Figure 12:
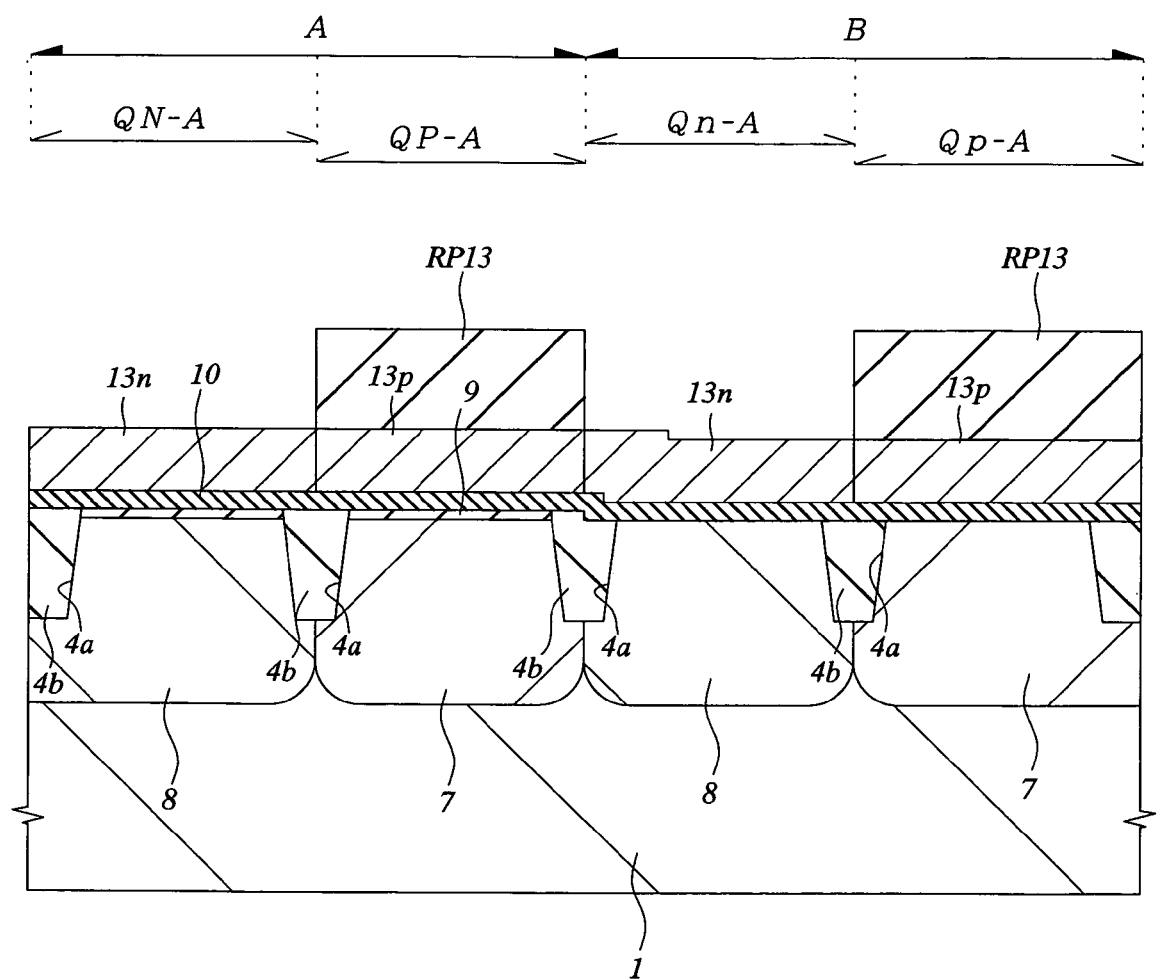

Then, after removing the resist pattern RP12 and successively forming a resist pattern RP13 to the pMIS-forming region (QP-A, Qp-A) in the regions A and B, n-impurity, for example, phosphorus (13n) is ion implanted to the silicon film 13 by using the resist pattern RP13 as a mask as shown in FIG. 12.

Then, after removing the resist pattern RP13, a heat treatment, for example, at 950° C. for 60 sec. is applied to the semiconductor substrate 1 to activate the n-impurity and p-impurity ion implanted to the silicon film 13, thereby converting the silicon film 13 in the nMIS-forming regions (QN-A, Qn-A) in the regions A and B into the n-silicon polycrystal film 13n and converting the silicon film 13 in the pMIS-forming region (QP-A, Qp-A) in the regions A and B into the p-silicon polycrystal film 13p. The silicon film 13 forms nMIS and PMIS gate electrodes as will be described later. By converting the gate electrode of nMIS into n type and converting the gate electrode of pMIS into p type, the short channel effect can be suppressed at a low threshold value.

Figure 13:
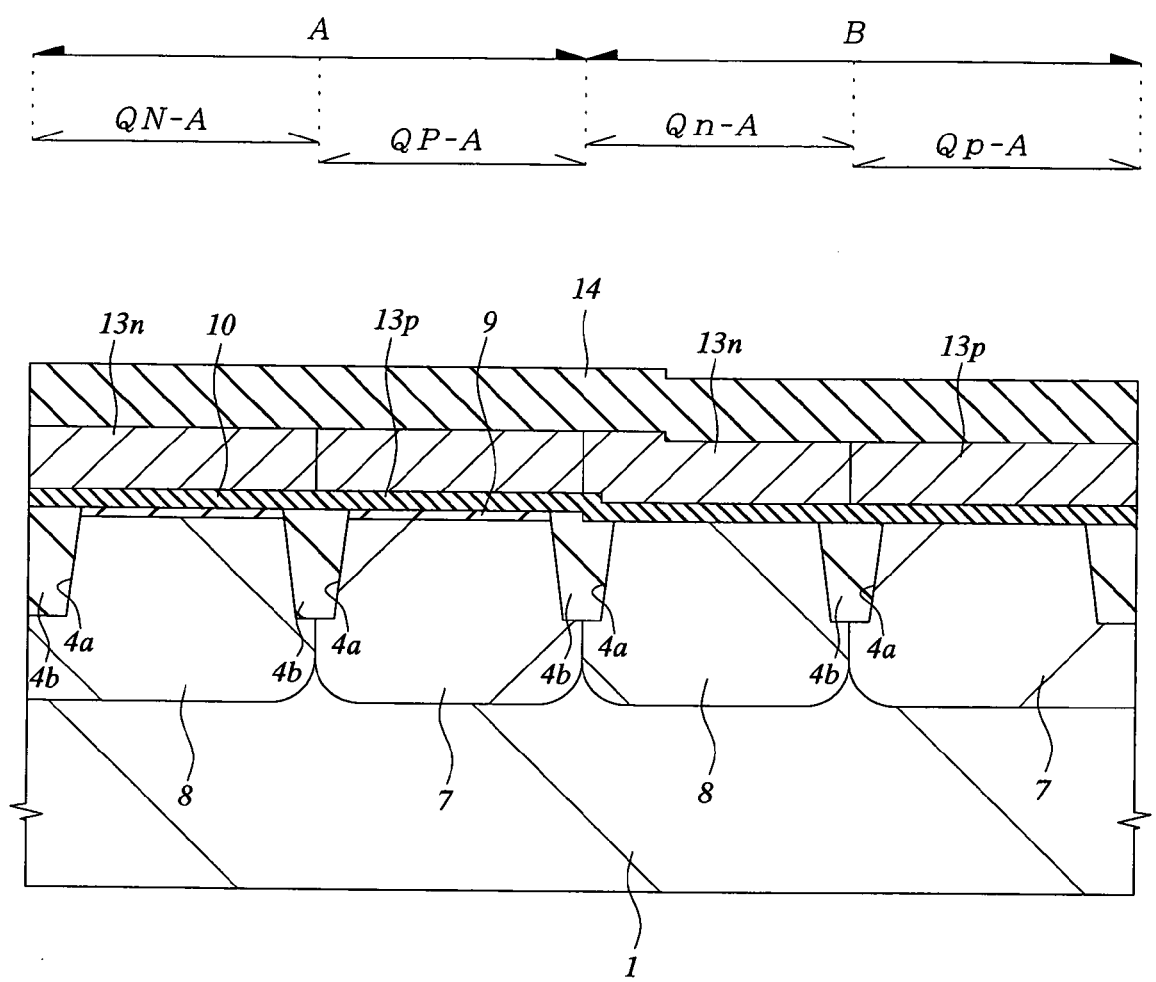
Figure 14:
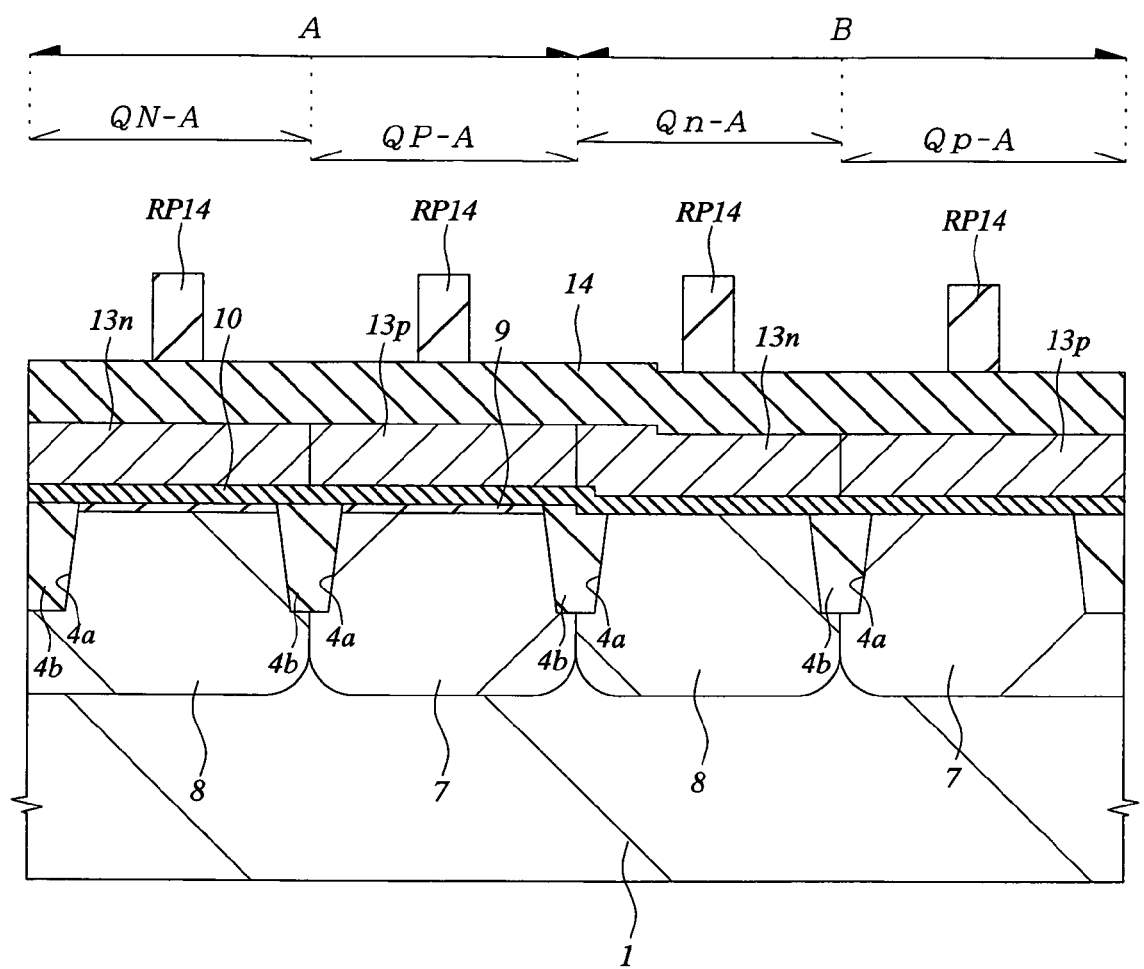

Then, after depositing, for example, a silicon oxide film (insulating film, cap insulating film) 14 to about 10 nm by a CVD method as the insulating film over the semiconductor substrate 1 as shown in FIG. 13, a resist pattern RP14 is formed in a region forming the gate electrode for nMIS and pMIS as shown in FIG. 14.

Figure 15:
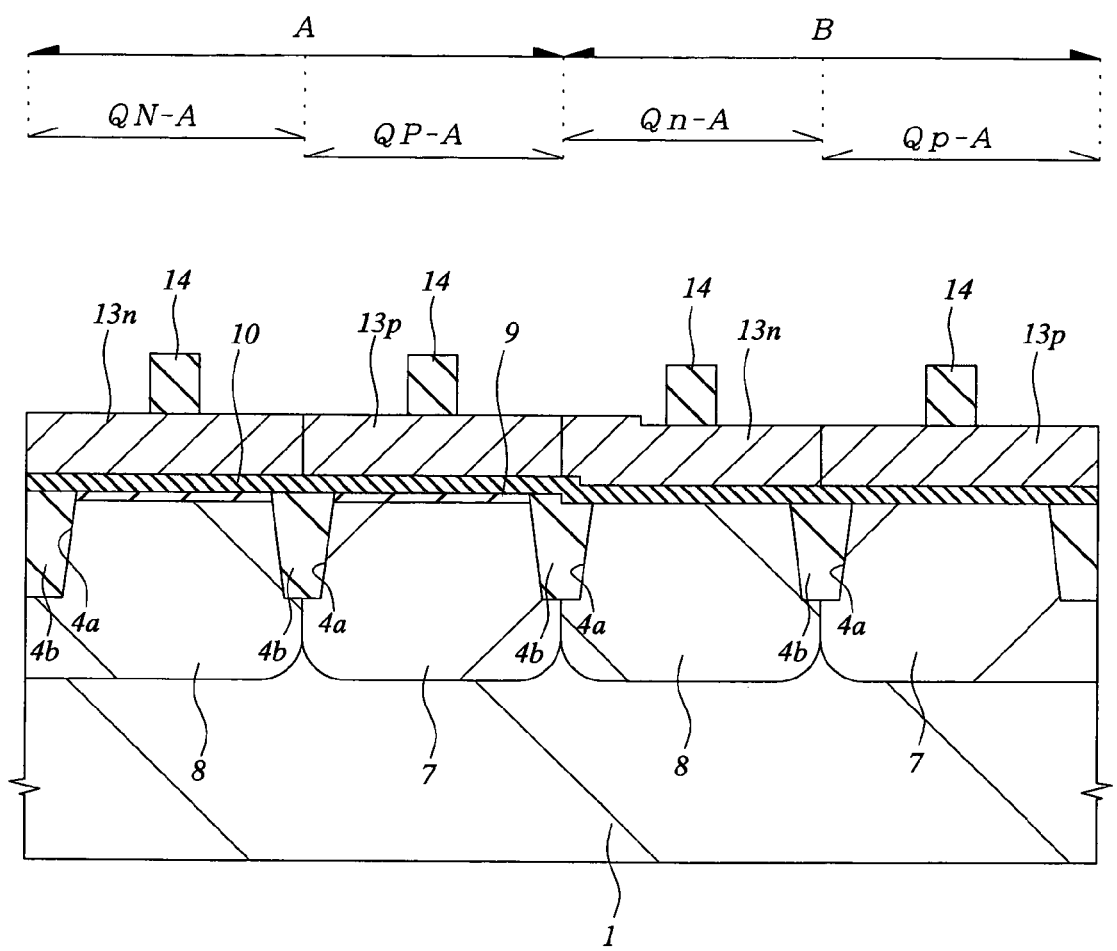
Figure 16:
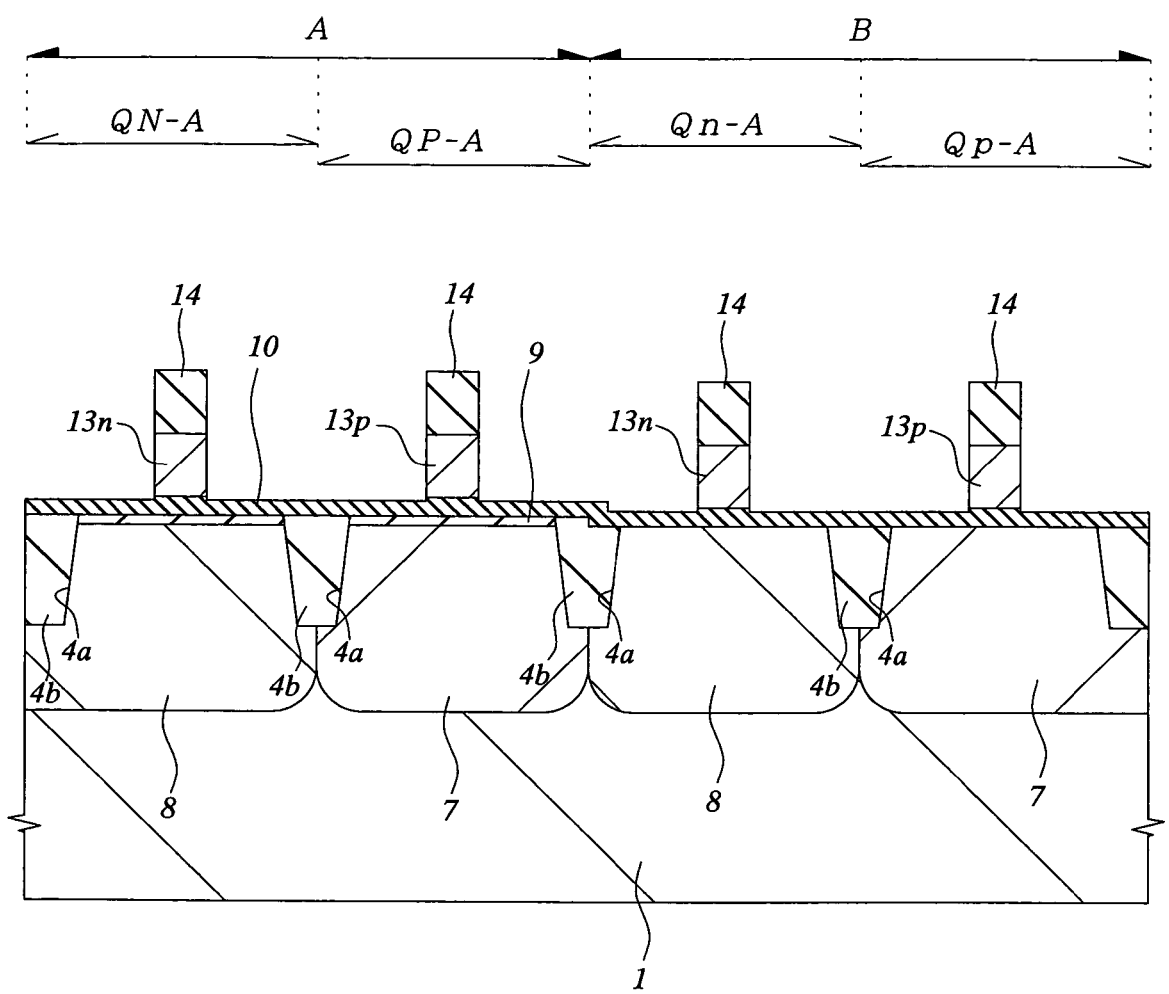

Then, as shown in FIG. 15, after etching the silicon oxide film 14 by using the resist pattern RP14 as a mask, the resist pattern RP14 is removed. Successively, as shown in FIG. 16, the silicon films 13n and 13p are etched by using the patterned silicon oxide film 14 as a mask.

As described above, by fabricating the silicon films 13n and 13p using the patterned silicon oxide film 14 as a mask, etching can be conducted at a good accuracy even when the gate electrodes (13n, 13p) have a fine pattern.

For example, while it is also possible to form the resist pattern RP14 directly on the silicon films 13n and 13p and fabricate the silicon films 13n and 13p by using the pattern as a mask, the atmosphere in the etching chamber is changed by the etched resist and the etching selectivity with respect to the silicon films 13n and 13p cannot sometimes be ensured to make fine fabrication difficult. Further, when the fine pattern is fabricated with a thick resist, resolution becomes difficult in view of the problem for the light transmittance. Accordingly, when the resist is used, the fine pattern cannot be fabricated at a high accuracy.

Accordingly, the intended effect described above can be obtained by etching the silicon film by using the silicon oxide film 14 that can easily ensure the selectivity relative to the silicon films 13n and 13p as a mask.

By the etching for the silicon films 13n and 13p, a gate electrode (conductor piece) 13n comprising an n-silicon polycrystal film is formed in the nMIS-forming region (QN-A, Qn-A) of the regions A and B, and a gate electrode (conductor piece) 13p comprising a p-silicon polycrystal film is formed in the pMIS-forming regions (QP-A, Qp-A) of the regions A and B. In this case, etching conditions for the silicon films 13n and 13p are controlled so as to leave the high dielectric constant insulating film 10 exposed between the gate electrodes 13n and 13p. That is, etching is conducted under the conditions where the etching selectivity of the silicon film relative to the high dielectric constant insulating film 10 or the silicon film 14 becomes large. In other words, etching is conducted under the conditions where the silicon film is etched easily while the high dielectric constant insulating film 10 or the silicon oxide film 14 is less etched. In this case, large etching selectivity means that (silicon film etching rate)/(high dielectric constant insulating film etching rate) is large and (silicon film etching rate)/(silicon oxide film etching rate) is large.

Figure 17:
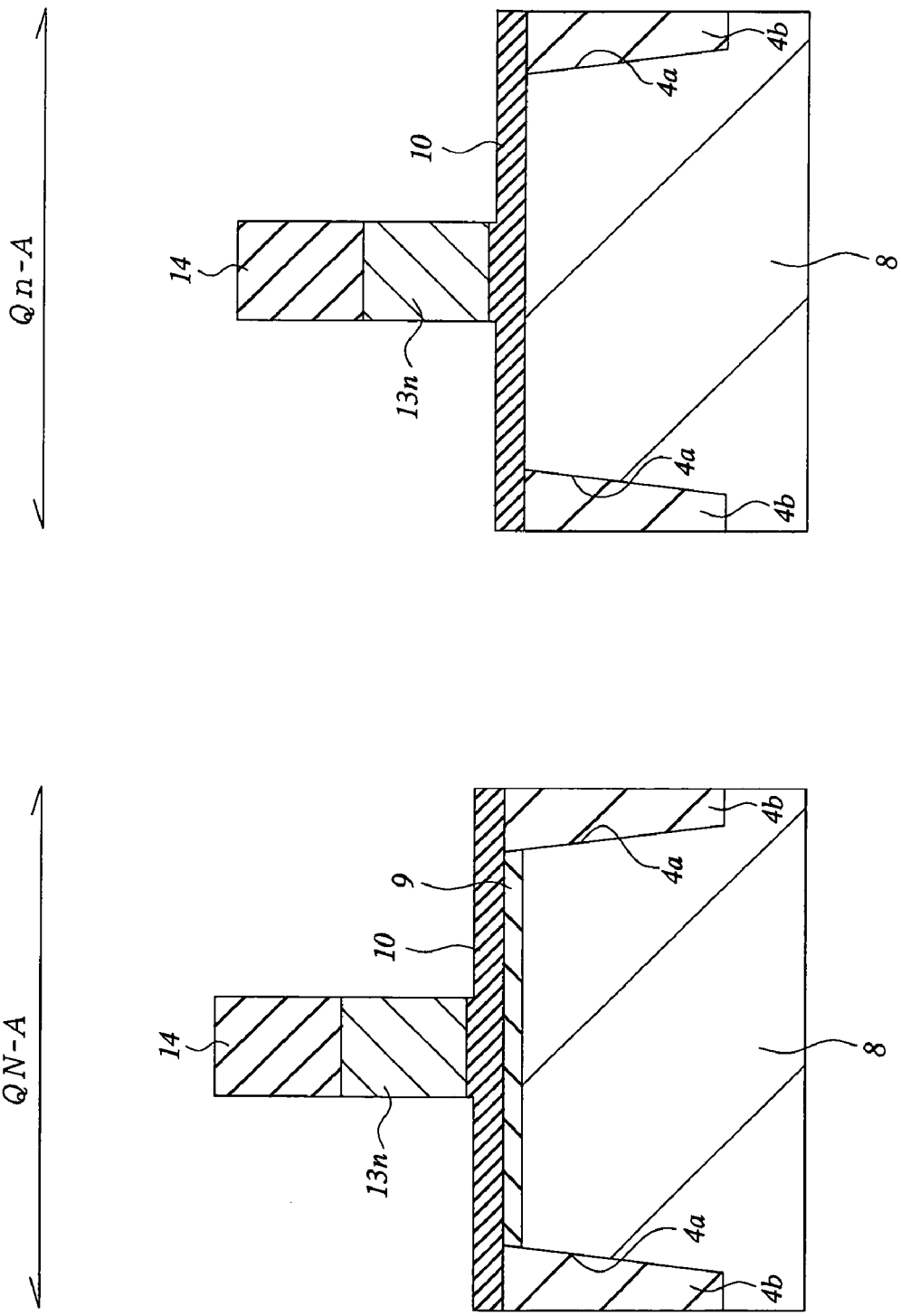

FIG. 17 shows an enlarged fragmental view for the NMIS-forming region QN-A and Qn-A in FIG. 16. An enlarged view for the pMIS-forming region is not illustrated since this has a similar structure excepting that the conduction type of the impurity is different. As illustrated, the surface of the high dielectric constant insulating film 10 may be retracted somewhat from the bottom of the gate electrode 13n so long as the high dielectric constant insulating film 10 remains above the semiconductor substrate 1.

Figure 18:
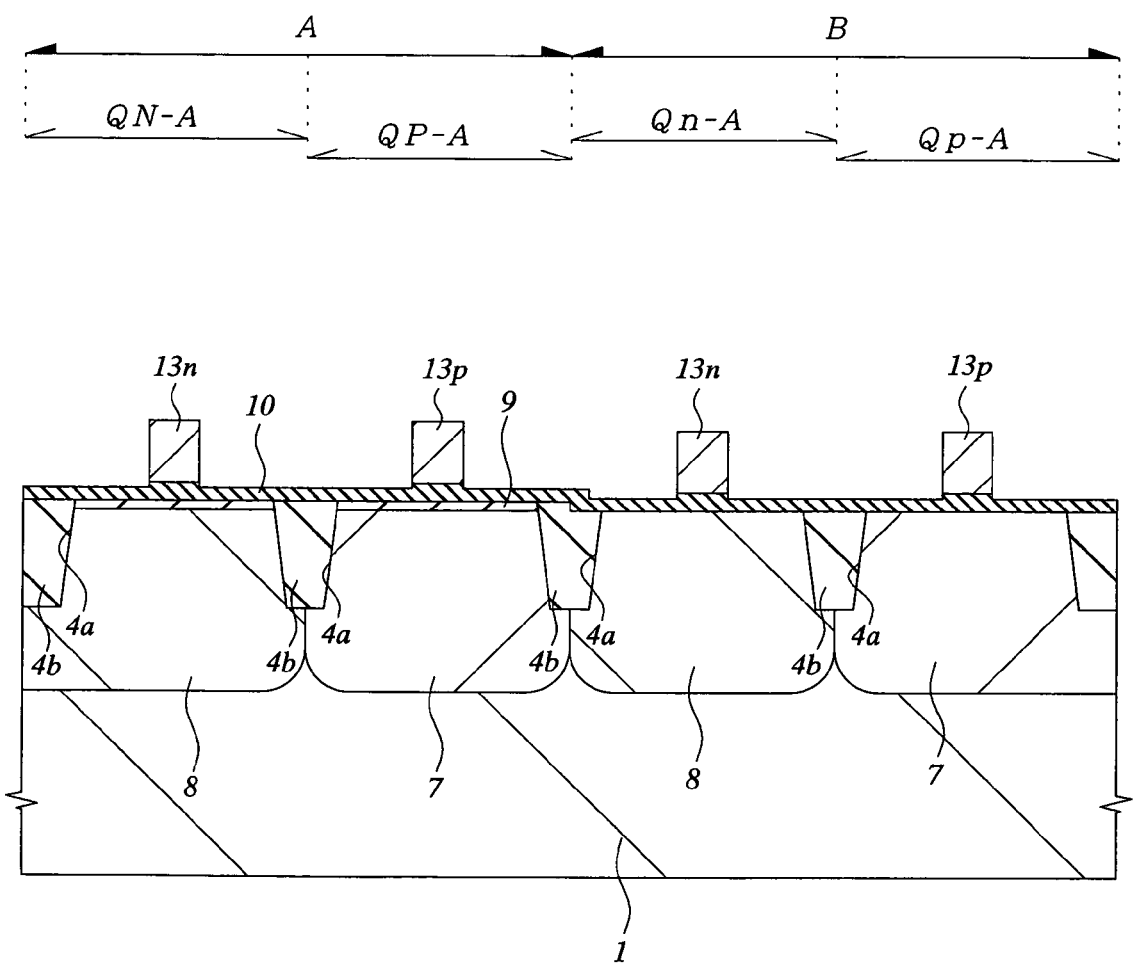

Then, as shown in FIG. 18, the silicon oxide film 14 is removed. In this case, etching is conducted under the conditions where the etching selectivity of the silicon oxide film 14 relative to the high dielectric constant insulating film 10 becomes large. In other words, etching is conducted under the condition that the silicon oxide film 14 is etched readily, whereas the high dielectric constant insulating film 10 is less etched. For example, in a case where the thickness of the silicon oxide film 14 is 10 nm, the etching amount for the high dielectric constant insulating film 10 is set to 0.1 nm or less. Since the etching selectivity means (silicon oxide etching rate)/(high dielectric constant film etching rate), the selectivity is 100 in this case.

In this step, large etching selectivity means that (silicon oxide film etching rate)/(high dielectric constant insulating film etching rate) is 100 or more. For example, in a case where diluted hydrofluoric acid (HF) is used as an etching solution, the silicon oxide film 14 is etched easily, whereas the high dielectric constant insulating film 10 is less etched. Etching for the silicon oxide film 14 may be either by wet etching or dry etching so long as the selectivity described above can be ensured.

FIG. 19 shows enlarged fragmentary views for the nMIS-forming regions QN-A and Qn-A in FIG. 18.

As described above in this embodiment, since etching is conducted for the silicon oxide film 14 under the condition where the etching selectivity of the silicon oxide film 14 relative to the high dielectric constant insulating film 10 becomes large, the high dielectric constant insulating film 10 can be left also at a portion below the end of the gate electrode. In other words, since the silicon oxide film 14 is removed in a state of leaving the high dielectric constant insulating film 10 on both ends of the gate electrode 13a to expose the upper surface of the gate electrode 13n, voltage withstanding of the gate insulating film (high dielectric constant insulating film 10) can be ensured. Further, customary step of oxidation for repairing gate edge (light oxidation) can be saved.

Figure 34:
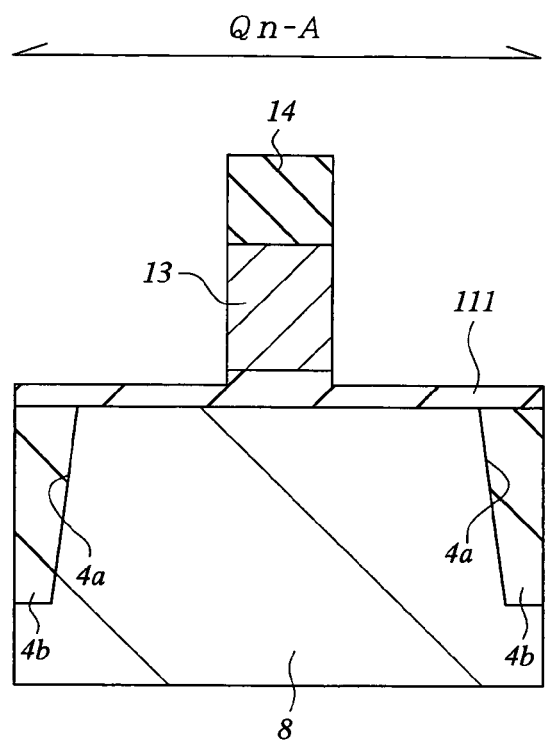
FIG. 34 to FIG. 36 are cross sectional views for a main portion of a substrate illustrating a method of producing a semiconductor integrated circuit device for illustrating the effect of the first embodiment according to the invention.
Figure 35:
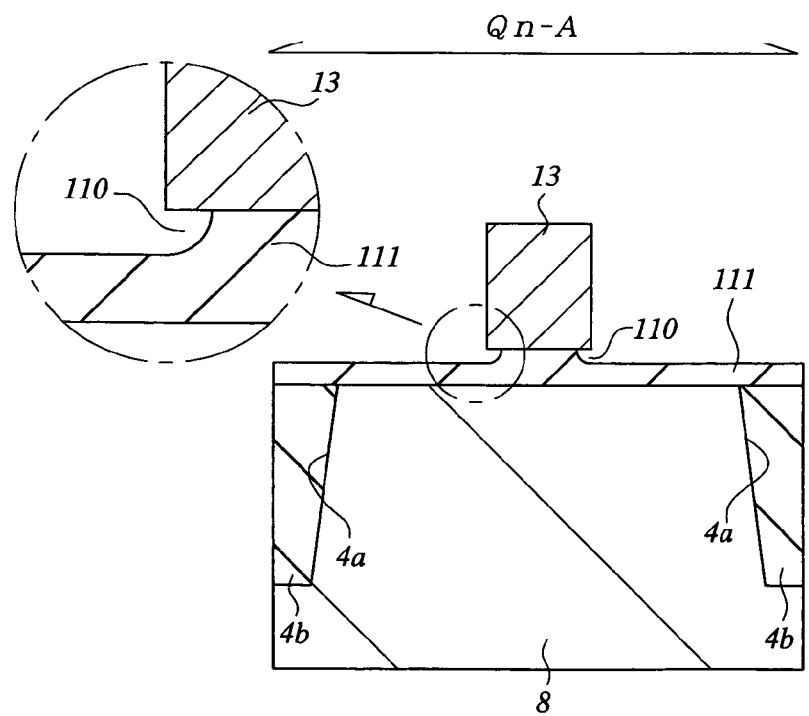

It is to be assumed that the gate insulating film is formed by, for example, thermally oxidizing the surface of the semiconductor substrate (silicon substrate) 1 as shown in FIG. 34. In this case, when the gate electrode is etched by using a gate insulating film (thermally oxidized film) 111 and etching the gate electrode by using the silicon oxide film 14 as a mask, and further, as shown in FIG. 35, removing the silicon oxide film 14, for example, by using a diluted hydrofluoric acid (HF) solution, etching proceeds as far as a portion below the end of the gate electrode 13. As a result, a pit 110 is formed below the end of the gate electrode 13. This is because the etching rate for the silicon oxide film 14 as the CVD oxide film is higher than that of the thermal oxide film 111, the composition of them is identical ($SiO_2$) and that the thickness of the silicon oxide film 14 is extremely large when compared with the thickness of the thermal oxide film 111. As has been described above, it is expected that the thickness of the thermal oxide film 111 is 1 nm or less when the width of the gate electrode is 0.1 μm or less.

Further, as shown particularly in FIG. 34, when the surface of the gate insulating film (thermal oxide film) 111 is retracted from the bottom after the etching for the gate electrode 13, the pit tends to increase.

When the pit 100 is thus formed, voltage withstanding below the gate electrode 13 is deteriorated.

Figure 36:
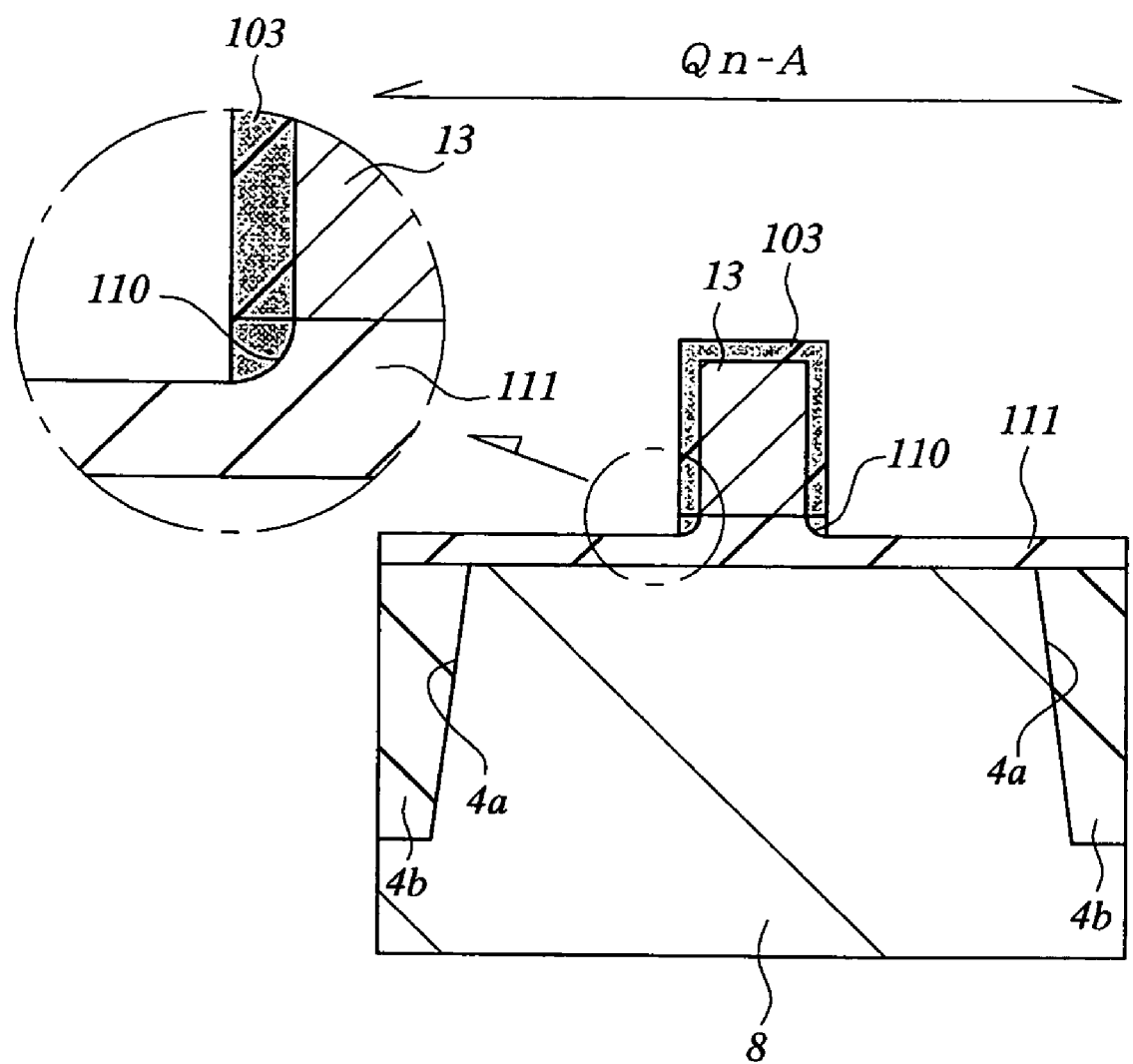

Then, as shown in FIG. 36, the surface of the gate electrode 13 comprising the silicon film is slightly oxidized to form a thermal oxide film 103 thereby forming a thermal oxide 103 again to the inside of the pit 110. The thermal oxide film 103 formed on the upper surface of the gate electrode 13 is subsequently removed.

On the other hand, in this embodiment, occurrence of the pit 110 as shown in FIG. 35 can be reduced by ensuring the etching selectivity utilizing the difference of the composition between the silicon oxide film 14 and the high dielectric constant insulating film 10.

Accordingly, the high dielectric constant insulating film 10 remains also below the end of the gate electrode 13 (FIG. 19). In other words, the high dielectric constant insulating film 10 extends as far as a portion below the end of the gate electrode 13, thereby enabling to improve the voltage withstand. Further, the capacitance can be ensured.

Figure 20:
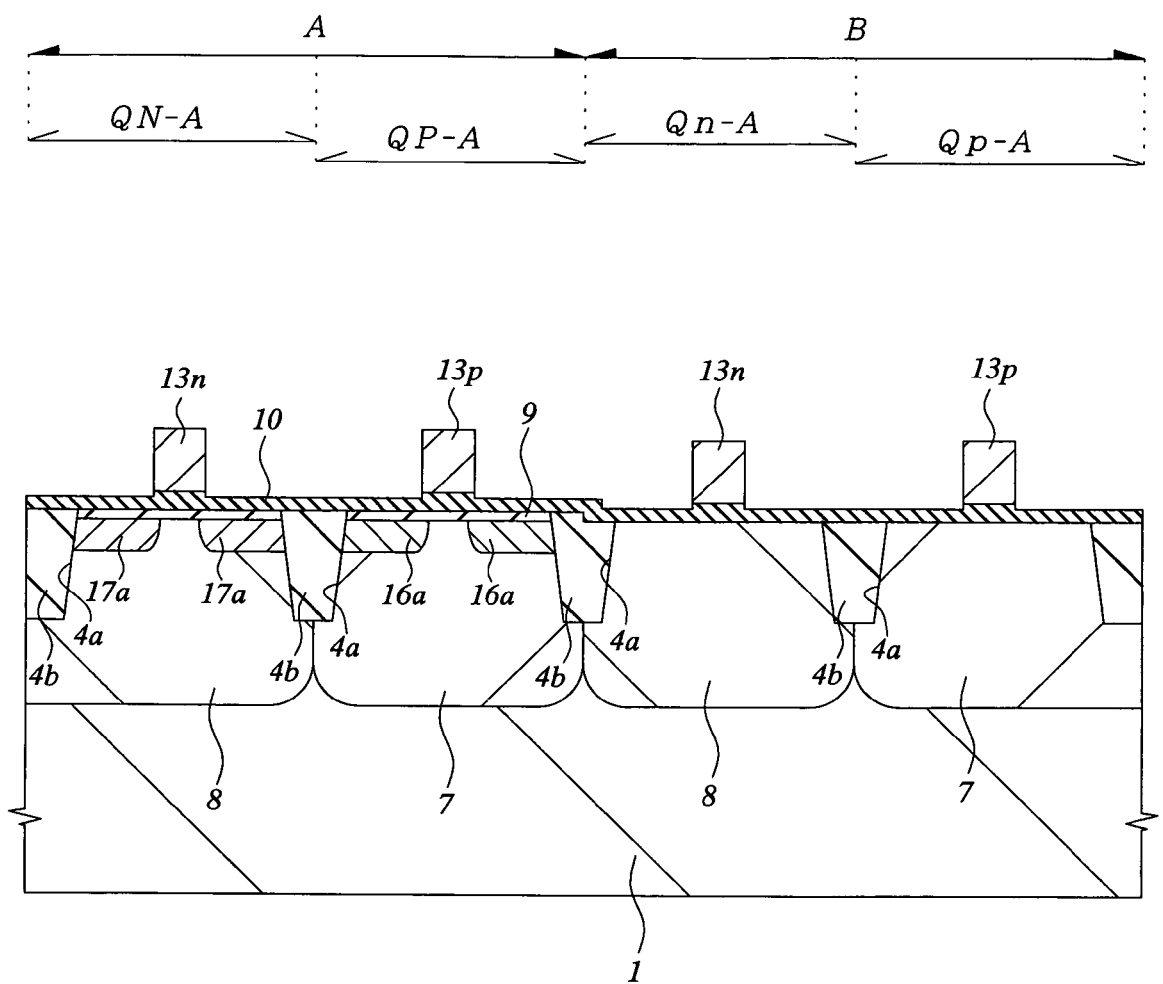

Then, as shown in FIG. 20, p-impurity, for example, boron fluoride is ion implanted to the n-wells 7 in the pMIS-forming region (QP-A) of the region A to form p$^-$-semiconductor regions 16a in the n-wells 7 on both sides of the gate electrode 13p, and successively, n-impurity, for example, phosphorus is ion implanted to form a Halo layer (not illustrated) that functions as a punch through stopper layer. Boron fluoride is implanted, for example, at an implantation energy of 2 to 3 KeV and at a dose of $1 \times 10^{15}$ cm$^{-2}$, while phosphorus is implanted, for example, at an implantation energy of 55 KeV and at a dose of $4 \times 10^{12}$ cm$^{-2}$.

Then, n-impurity, for example, arsenic is ion implanted to the p-wells 8 in the nMIS-forming region (QN-A) of the region A to form n-semiconductor regions 17a in the p-wells 7 on both sides of the gate electrode 13p, and successively, p-impurity, for example, boron is ion implanted to form a Halo layer (not illustrated). Arsenic is implanted, for example, at an implantation energy of 5 KeV and at a dose of $2 \times 10^{15}$ cm$^{-2}$, while boron is implanted, for example, at an implantation energy of 20 KeV and at a dose of $6 \times 10^{12}$ cm$^{-2}$.

Figure 21:
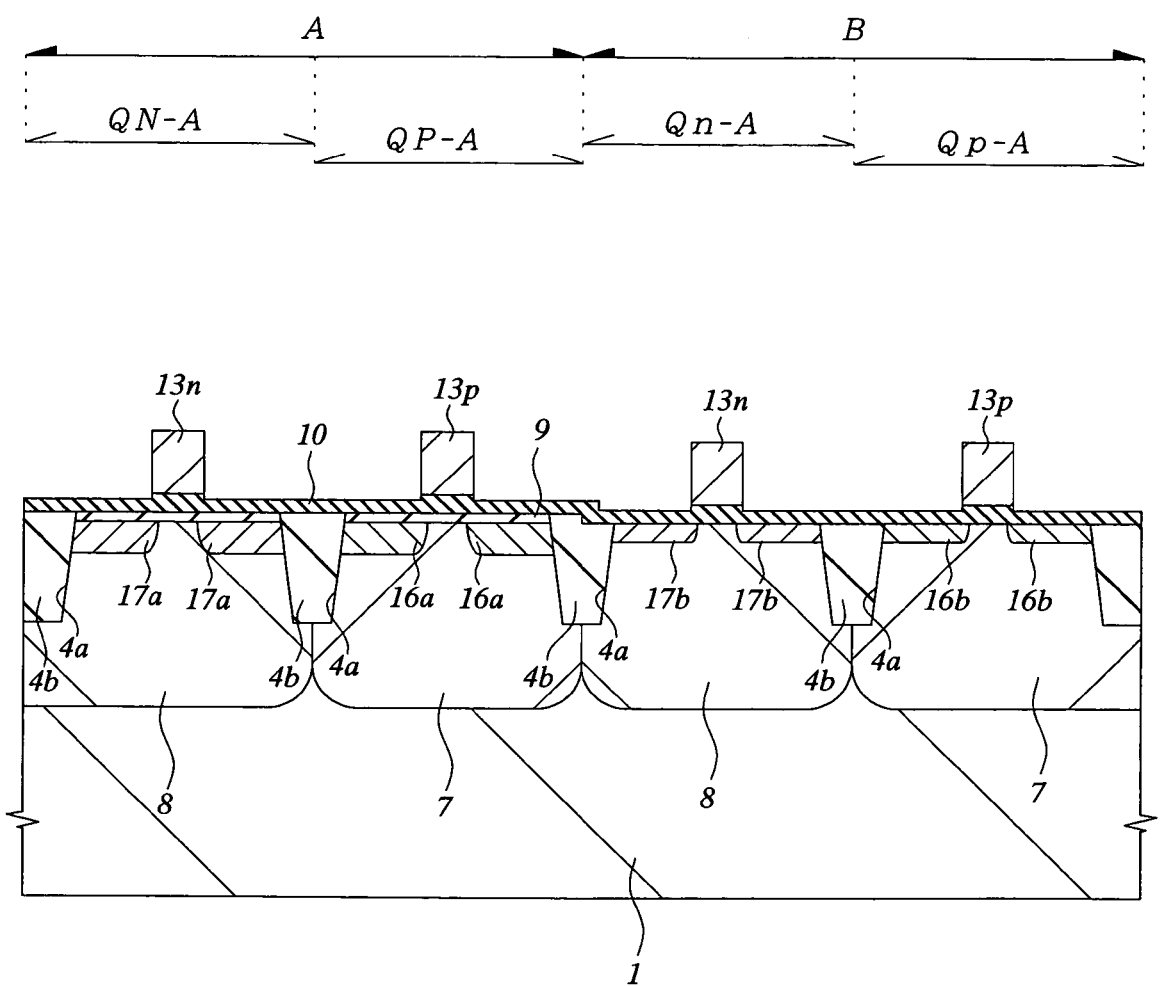

Then, as shown in FIG. 21, p-impurity, for example, boron fluoride is ion implanted to n-wells 7 in the pMIS-forming region (Qp-A) of the region B to form p-extension region 16b to the n-wells 7 on both sides of the gate electrode 13p, and successively, n-impurity, for example, phosphorus is implanted to form a Halo layer (not illustrated). Boron fluoride is implanted, for example, at an implantation energy of 2 to 3 KeV and at a dose of $1 \times 10^{15}$ cm$^{-2}$, while phosphorus is implanted, for example, at an implantation energy of 55 KeV and at a dose of $1 \times 10^{13}$ cm$^{-2}$.

Then, n-impurity, for example, arsenic is ion implanted to p-wells 8 in the nMIS-forming region (Qn-A) of the region B to form p-extension region 17b to the p-wells 8 on both sides of the gate electrode 13n, and successively, p-impurity, for example, boron is implanted to form a Halo layer (not illustrated). Arsenic is implanted, for example, at an implantation energy of 3 KeV and at a dose of $2 \times 10^{15}$ cm$^{-2}$, and boron is implanted, for example, at an implantation energy of 55 KeV and at a dose of $1 \times 10^{13}$ cm$^{-2}$.

Figure 22:
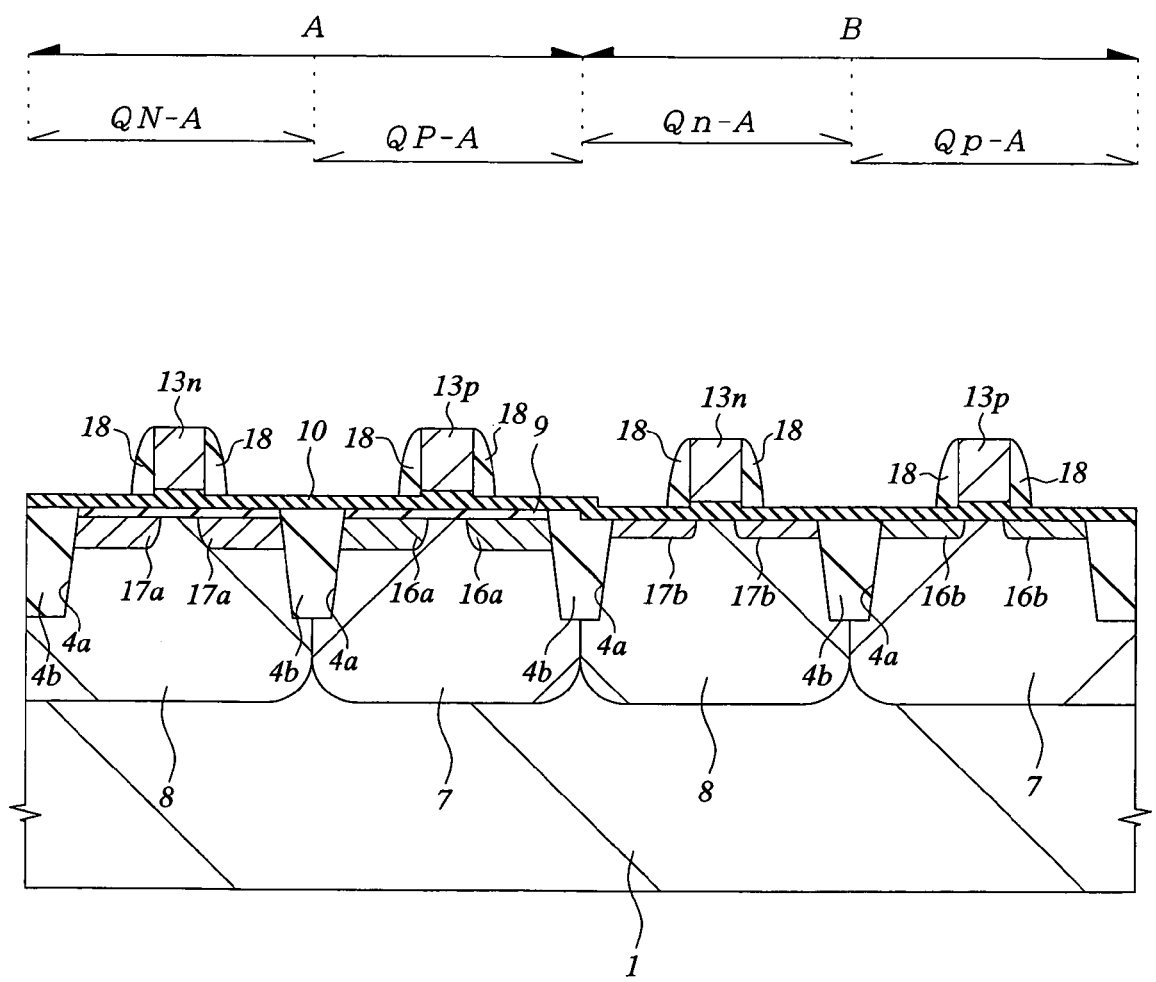

Then, as shown in FIG. 22, a silicon oxide film (insulating film) is deposited by a CVD method over a semiconductor substrate 1, and successively, the silicon oxide film is anisotropically etched to form sidewalls (sidewall films) 18 on the sidewalls of the gate electrodes 13n and 13p.

In this embodiment, since the high dielectric constant insulating film 10 is left till the formation of the sidewalls 18, damages to the semiconductor substrate 1 can be reduced because the high dielectric constant insulating film 10 functions as an etching stopper layer.

Figure 23:
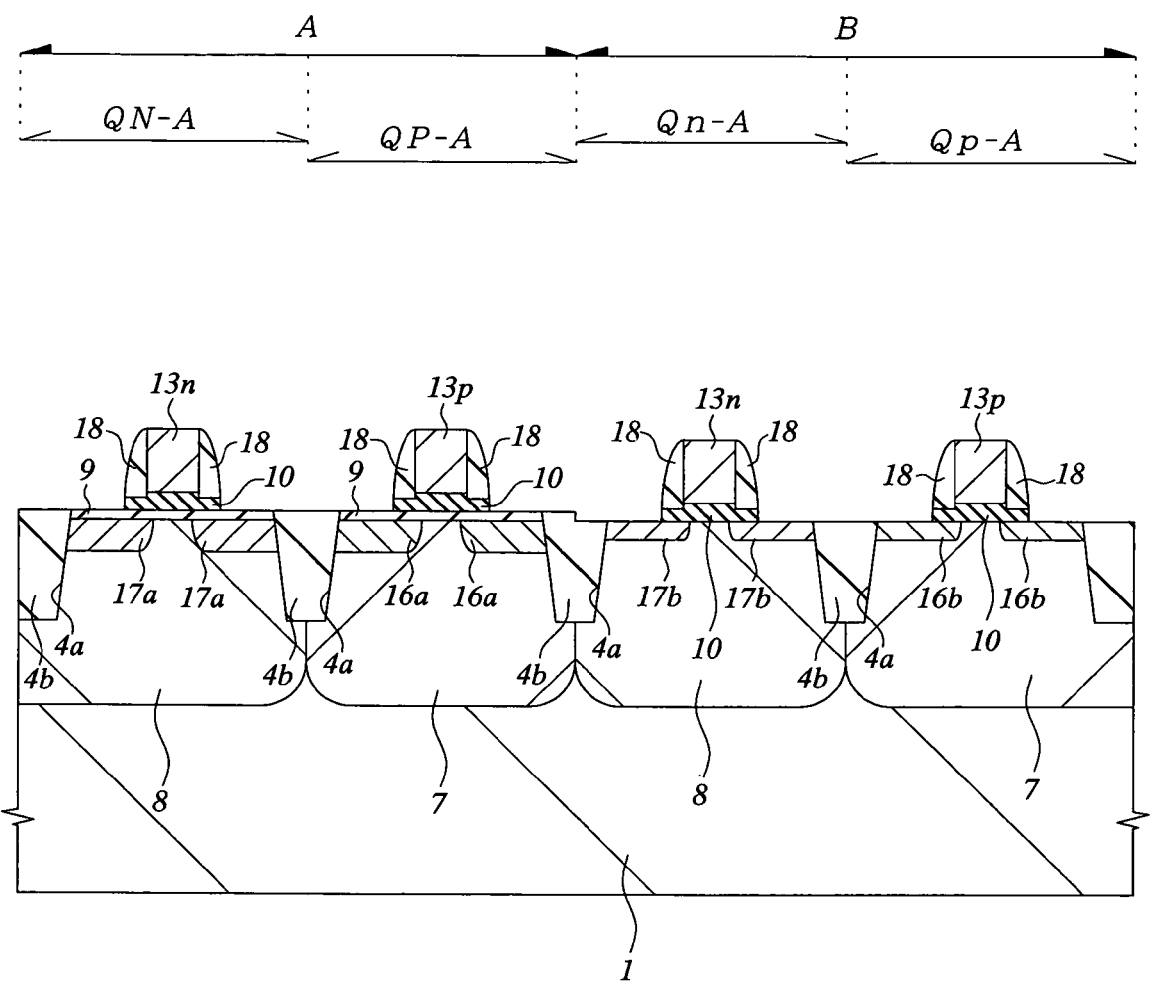

Then, as shown in FIG. 23, by using the sidewalls 18 and the gate electrodes 13n and 13p as a mask, the high dielectric constant insulating film 10 exposed between them is removed, for example, by sputter etching.

In this embodiment, since the high dielectric constant insulating film 10 is left till the formation of the sidewalls 18, even when etching proceeds from a portion below the end of the sidewalls 18 upon anisotropic etching of the silicon oxide film or sputter etching of the high dielectric constant insulating film 10, etching less proceeds to the portion below the end of the gate electrodes (13n, 13p), thereby enabling to ensure the voltage withstanding of the gate insulating film.

Figure 24:
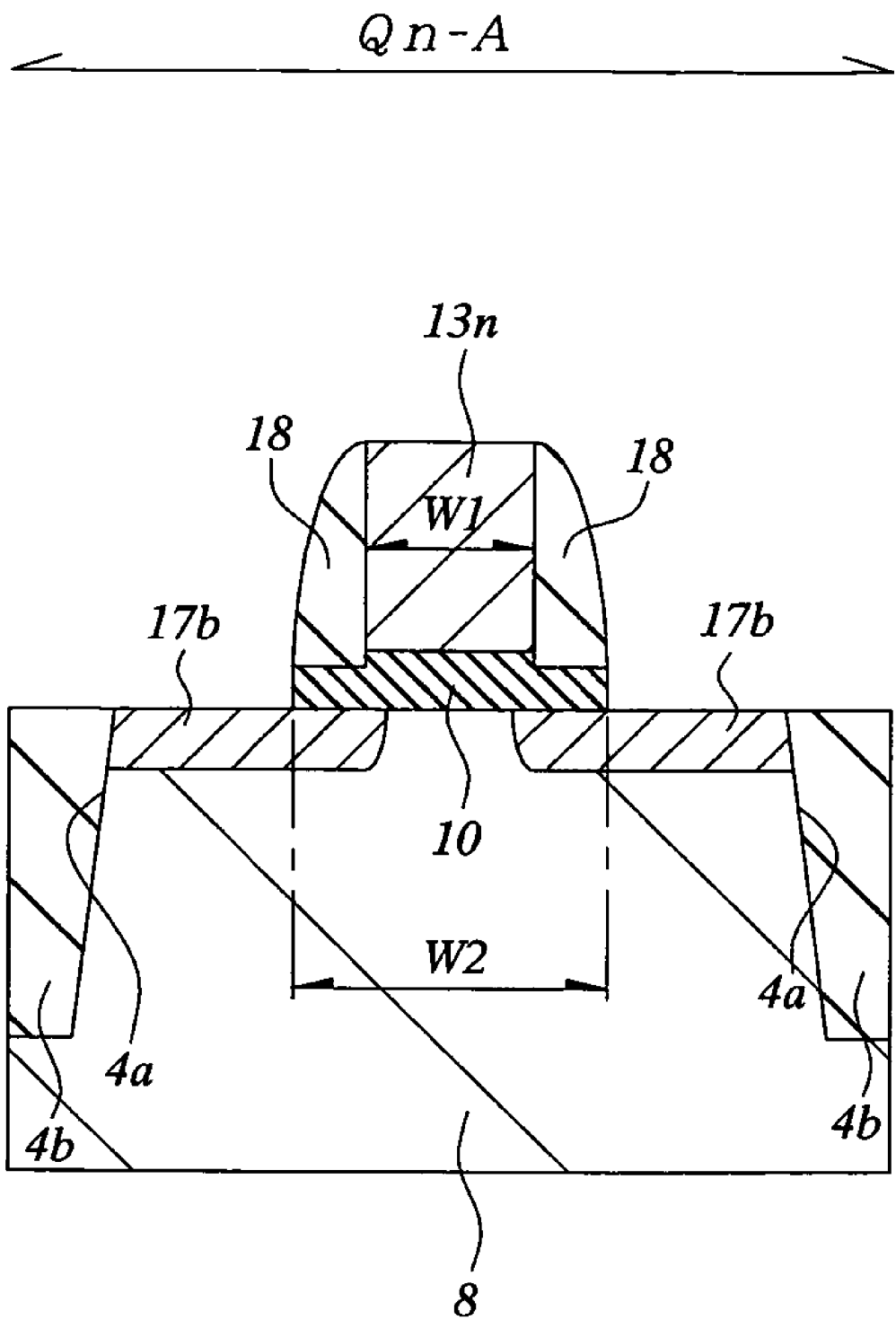

FIG. 24 shows a fragmentary enlarged view for the nMIS-forming region Qn-A. As illustrated, the high dielectric constant insulating film 10 extends as far as the portion below the sidewall 18. Further, the width W1 of the high dielectric constant insulating film 10 below the gate electrode 13n is smaller than the width W2 at the surface portion of the semiconductor substrate (W1<W2).

Then, as shown in FIG. 25, by using the sidewalls 18 and the gate electrodes 13n and 13p as a mask, the silicon oxide film 9 in the region A exposed between them is removed, for example, by wet etching.

Figure 26:
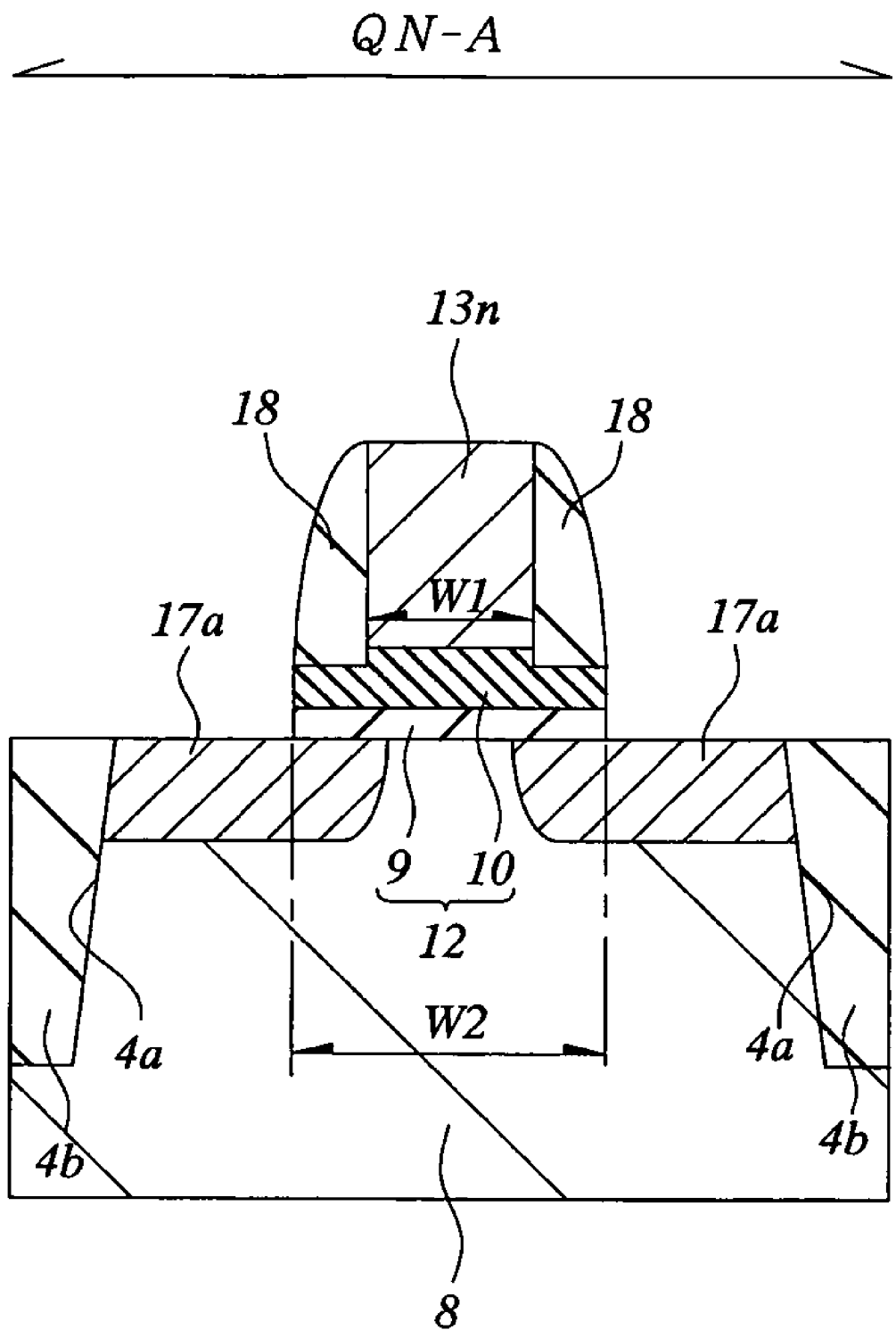

FIG. 26 shows a fragmentary enlarged view for an NMIS-forming region QN-A in FIG. 25. As illustrated, the high dielectric constant insulating film 10 and the silicon oxide film 9 extend as far as a portion below the sidewalls 18. Further, the width W1 for the high dielectric constant insulating film 10 below the gate electrode is smaller than the width W2 on the surface of the silicon oxide film (W1<W2).

As a result, a gate insulating film 11 comprising a high dielectric constant insulating film 10 having an equivalent oxide thickness of about 1 nm is formed in the region B, while a gate insulating film 12 comprising a laminate form of the high dielectric constant insulating film 10 and the silicon oxide film 9 having an equivalent oxide thickness of about 5 to 6 nm (FIG. 25).

Figure 27:
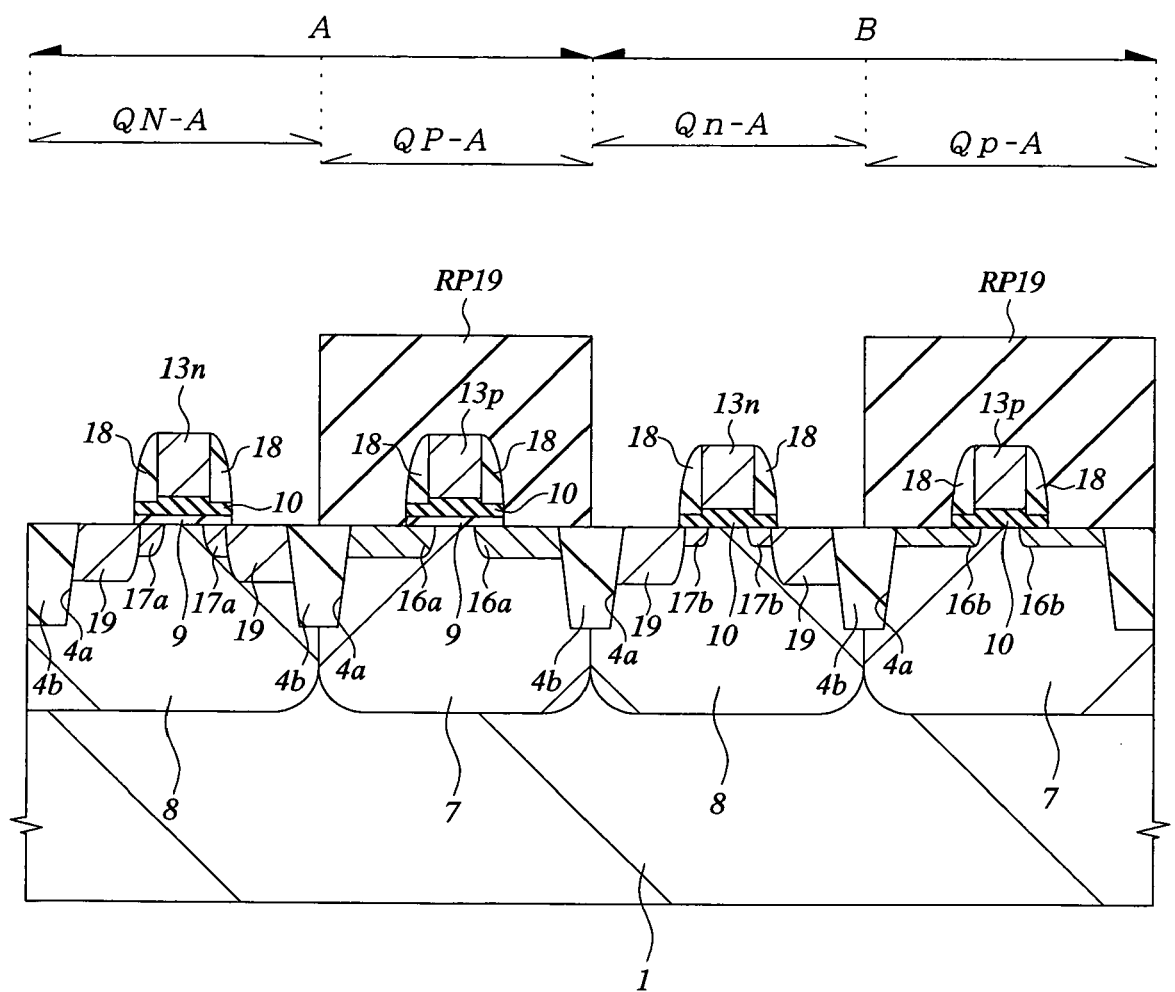

Then, as shown in FIG. 27, n-impurity, for example, arsenic is ion implanted into the p-wells 8 of the nMIS-forming regions (QN-A, Qn-A) of the regions A and B by using a resist pattern RP19 as a mask to form an $n^+$-semiconductor regions 19 in the p-wells 8 on both sides of the gate electrode 13n. The $n^+$-semiconductor regions 19 are formed in self alignment relative to the gate electrodes 13n and the sidewalls 18 and function as source and drain for the nMIS. In this case, the n-impurity is ion implanted also into the gate electrode 13n. Since the impurities in the source and drain and the gate electrode 13n of nMIS are of an identical conduction type, impurity implantation causes no problem, and further, compensates the impurity, if insufficient, in the gate electrode 13n.

Figure 28:
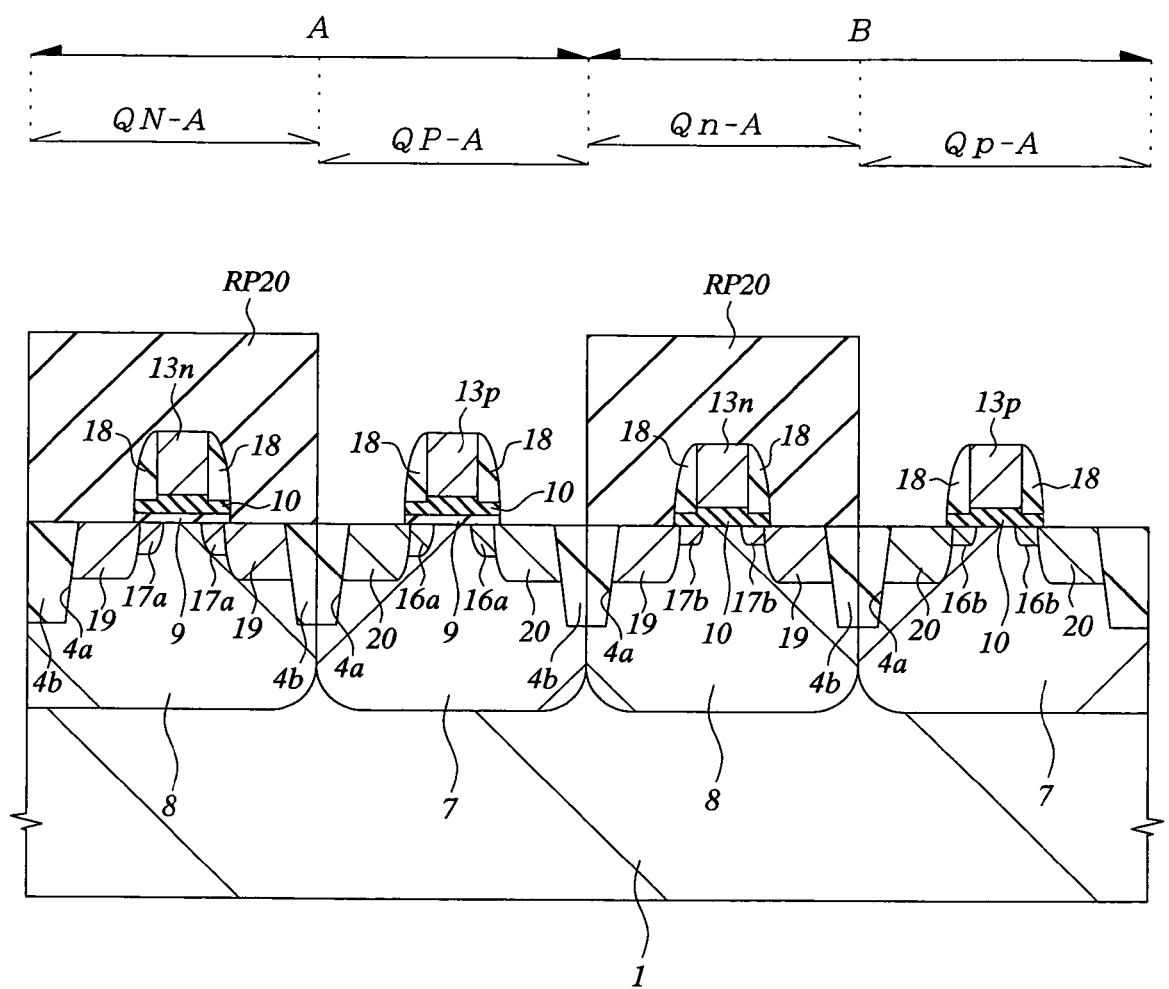

Then, the resist pattern RP19 is removed, and as shown in FIG. 28, p-impurity, for example, boron fluoride is ion implanted to the n-wells 7 in the pMIS-forming regions (QP-A, Qp-A) of the regions A and B by using a resist pattern RP20 as a mask, to form a $p^+$-semiconductor regions 20 in the n-wells 7 on both sides of the gate electrode 13p. The $p^+$-semiconductor region 20 is formed in self alignment relative to the gate electrode 13p and the sidewalls 18 and functions as the source and drain for the pMIS. Further, the p-impurity is implanted also into the gate electrode 13p. Since impurities in the source and drain and the gate electrode 13p of the PMIS are of an identical conduction type, impurity implantation causes no problem, and further, compensates the impurity, if insufficient, in the gate electrode 13p. Then, a resist pattern RP20 is removed.

Figure 29:
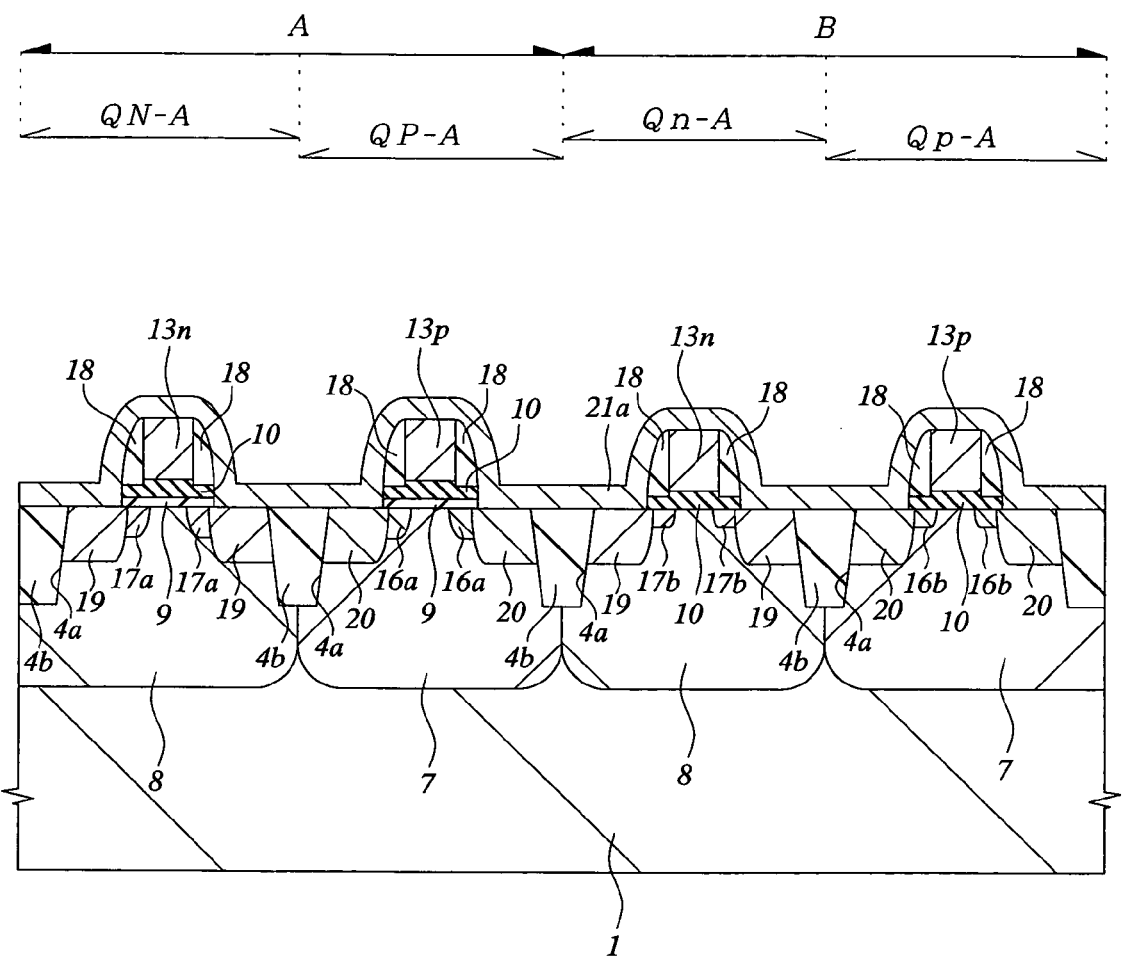

Then, as shown in FIG. 29, a cobalt film with a thickness of, for example, about 10 to 20 nm is deposited as a high metal film 21a over the semiconductor substrate 1, for example, by the sputtering method.

Figure 30:
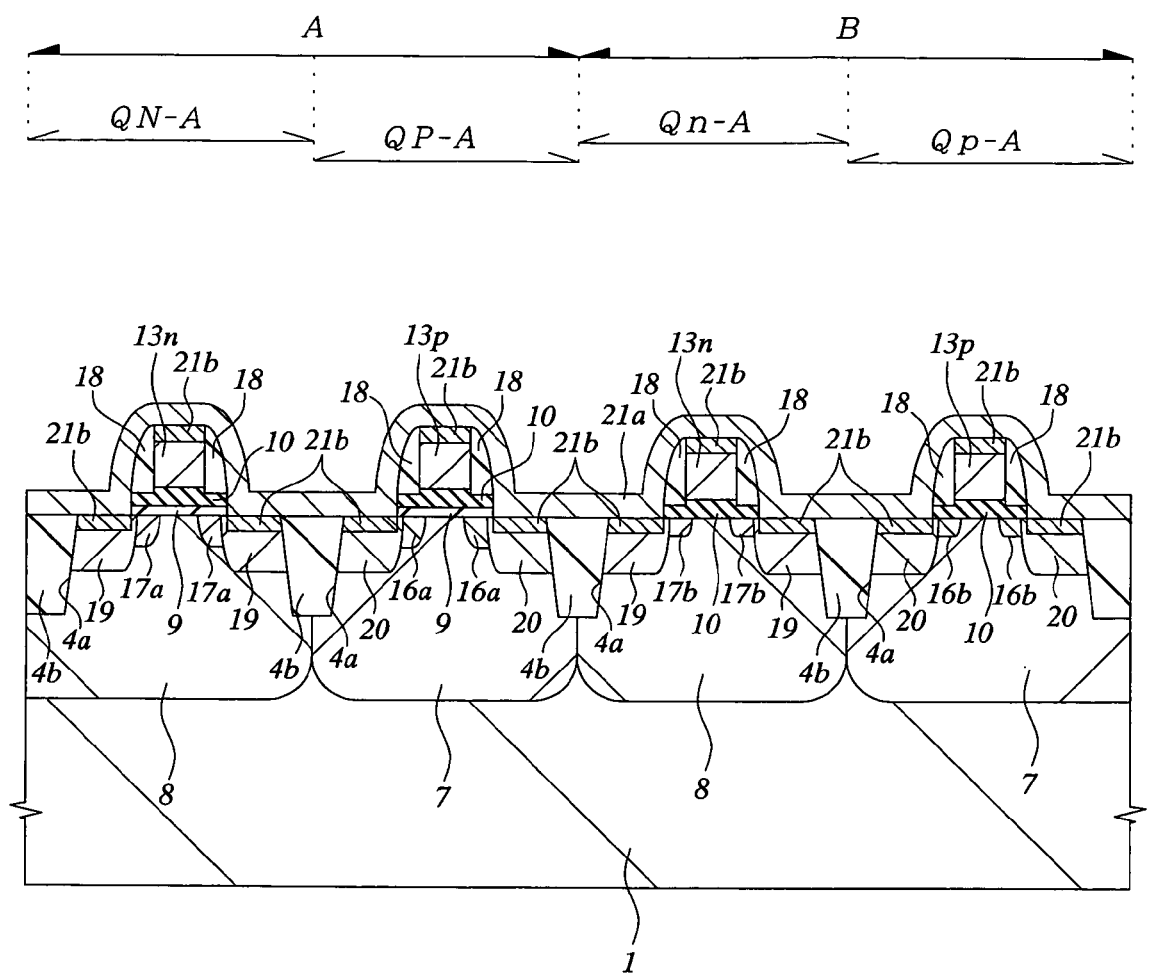

Then, as shown in FIG. 30, a heat treatment at about 500 to 600° C. is applied to the semiconductor substrate 1 to form a cobalt silicide layer 21b having a thickness of about 30 nm and a specific resistivity of about 4 Ωcm selectively on the surface of the gate electrode 13n and the surface of the $n^+$-semiconductor region 19 of nMIS, as well as the surface of the gate electrode 13p and the surface of the $p^+$-semiconductor region 20 of pMIS. In other words, a reaction layer between silicon and the high melting metal film is formed at a portion of contact between the gate electrode and the source and drain regions comprising silicon and the high melting metal film (FIG. 30).

Figure 31:
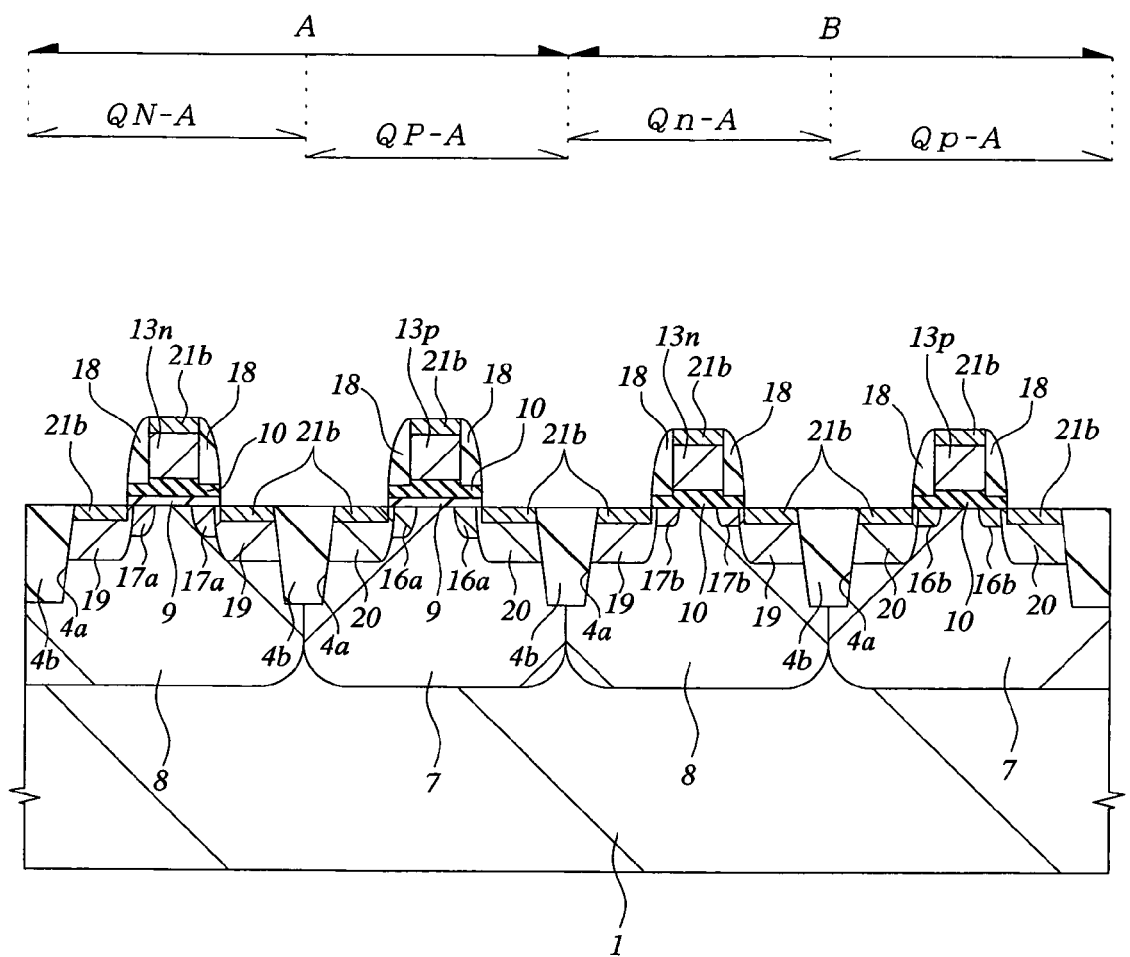

Subsequently, as shown in FIG. 31, an unreacted cobalt film 21a is removed by wet etching and then a heat treatment at about 700 to 800° C. is applied to the semiconductor substrate 1 for reducing the resistance of the silicide layer 21b.

In this embodiment, since the silicon oxide film 14 is previously removed, the silicide layer 21 can be formed also on the gate electrodes 13n and 13p, to reduce the resistance of the gate electrode (13n, 13p) per se, and further, the contact resistance between a plug to be described later and the gate electrode can be reduced.

Further, the silicide layer 21b is formed also on the $n^+$-semiconductor region 19 and the $p^+$-semiconductor region 20 (source and drain regions), to reduce the resistance thereof, and further, it can reduce the contact resistance between the plug to be described later and the source and drain regions.

Figure 32:
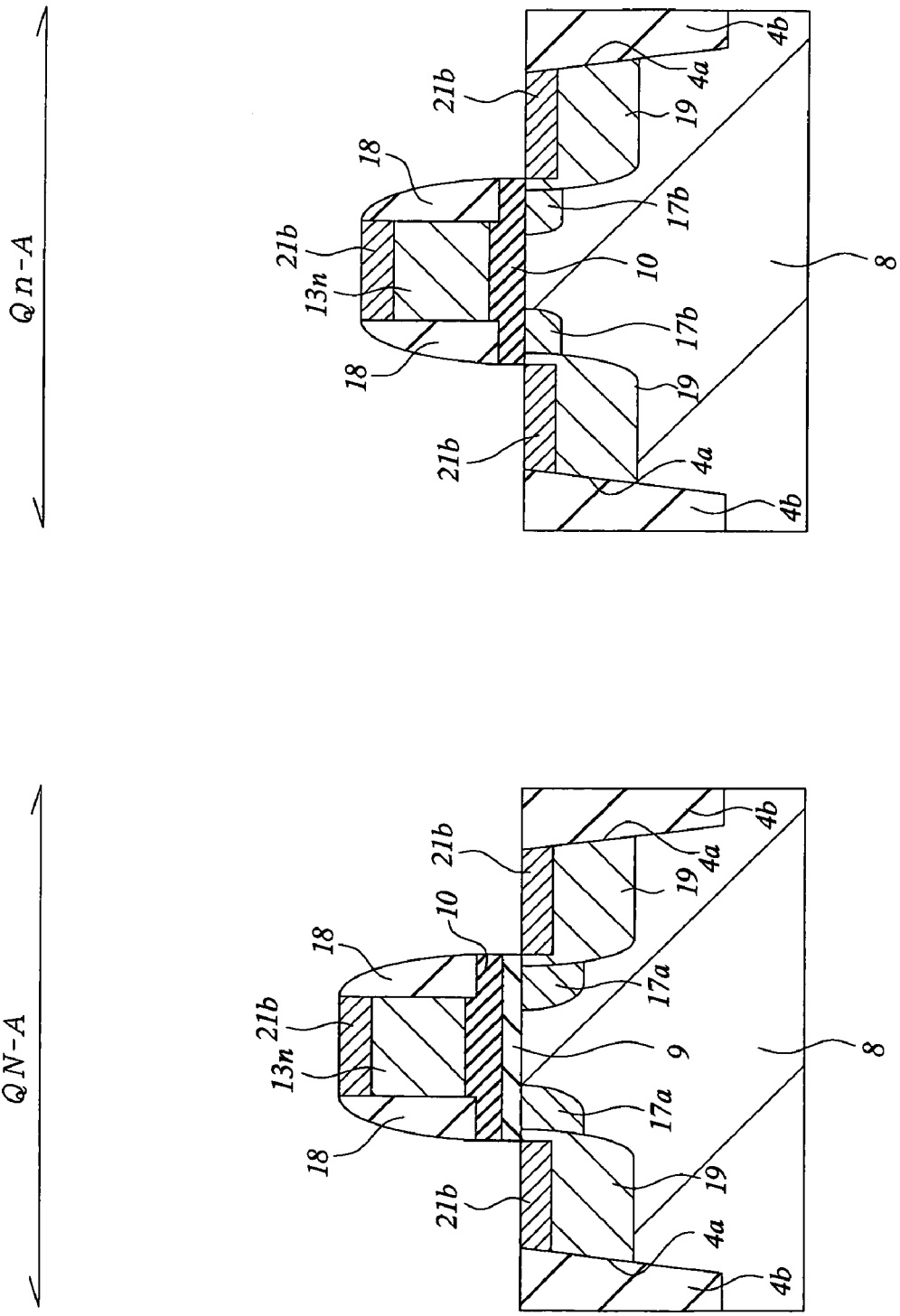

For forming the silicide layer on the gate electrodes (13n, 13p) as described above, it may suffice that the silicon oxide film 14 on the gate electrode has been removed under the conditions described above prior to this step. FIG. 32 shows a fragmentary enlarged view for the nMIS-forming regions QN-A and Qn-A in FIG. 31.

Figure 33:
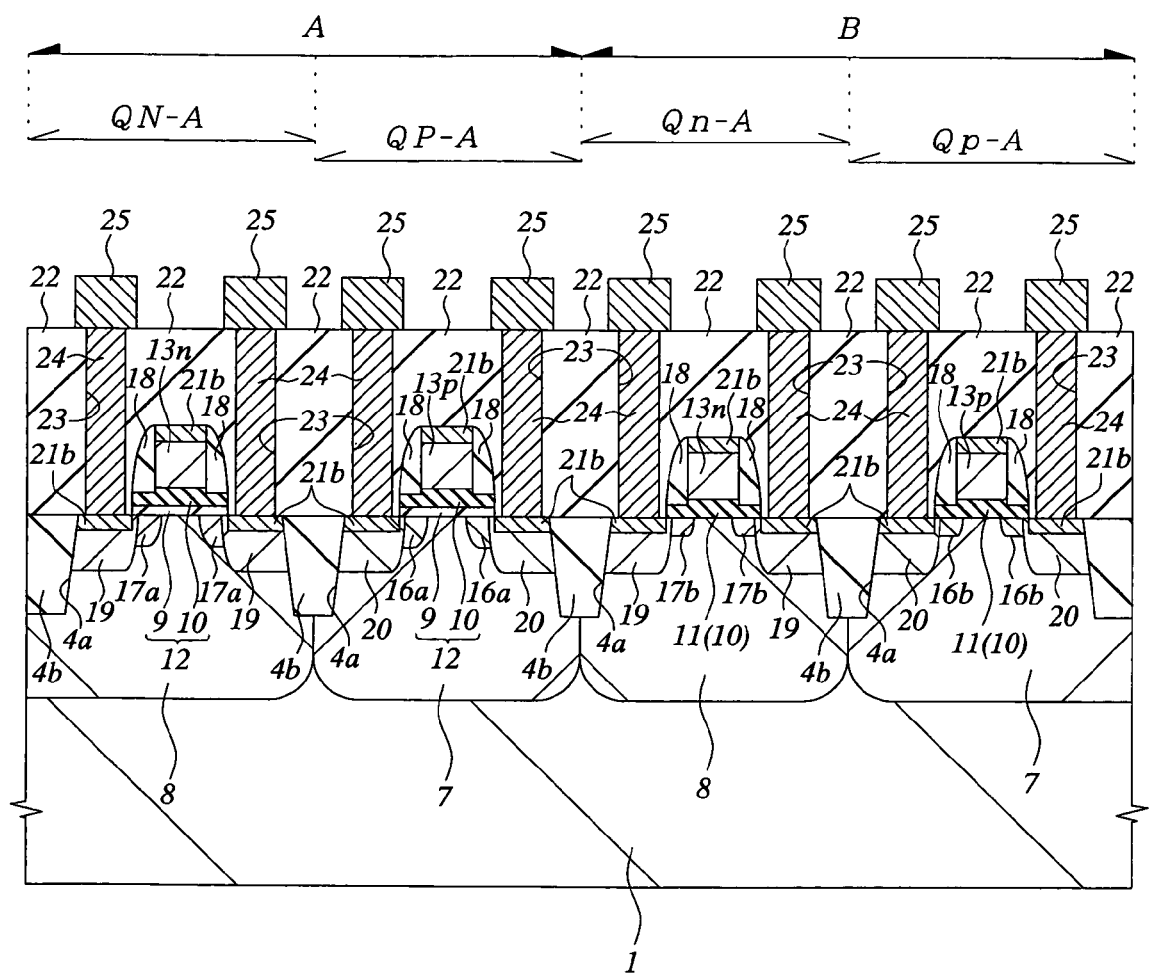

Then, as shown in FIG. 33, after forming a silicon film 22 over the semiconductor substrate 1, the surface of the silicon oxide film 21 is planarized by polishing, for example, by a CMP method. The silicon oxide film 22 can be formed, for example, by a plasma CVD method using TEOS (Tetraethylorthosilicate: $Si(OC_2H_5)_4$) and ozone ($O_3$) as a source gas. Such a film is referred to as a TEOS film.

Then, connection holes 23 are formed to the silicon oxide film 22 by etching by using the resist pattern as a mask. The connection holes 23 are formed, for example, to a necessary portion in the $n^+$-semiconductor region 19 or the $p^+$-semiconductor region 20. Although not illustrated, they are formed also over the gate electrode.

Then, a titanium nitride film is deposited, for example, by a CVD method over the entire surface of the semiconductor substrate 1 including the inside of the connection holes 23, and further, a tungsten film for burying the connection holes 23 is deposited, for example, by a CVD method. Subsequently, the titanium nitride film and the tungsten film in the regions other than the connection holes 23 are removed, for example, by a CMP method to form plugs 24 in the inside of the connection holes 23.

Successively, after depositing, for example, a tungsten film on the semiconductor substrate 1, the tungsten film is fabricated by dry etching by using a resist pattern as a mask to form wirings 25 for a first wiring layer. The tungsten film can be formed by a CVD method or a sputtering method.

Then, after forming wirings for the upper layer, the entire surface of the semiconductor substrate 1 is covered with a passivation film to substantially complete a semiconductor integrated circuit device as the first embodiment according to the invention.

While explanations have been made for the embodiment referring to an example of MISFET having two types of gate insulating films (11, 12), the invention is applicable not being restricted to such a case but also to a case of constituting the gate insulating film of MISFET with one type (11 or 12). However, the effect is large when the embodiment is applied to MISFET having two types of gate insulating films (11, 12).

That is, since it may suffice that the capacitance of the gate insulating film of MISFET in the region A is small, it is also possible to constitute the film only with a thermal oxidation film formed to a large thickness.

However, in this case, oxidation for repairing gate edge is obliged as has been described above with reference to FIG. 34 to FIG. 36 in the production process of MISFET in the region A.

Accordingly, matching property of the production process can be obtained by using the laminate film for the gate insulating film of the MISFET in the region A, using a thermal oxidized film for the underlying layer and a high dielectric constant insulating film for the upper layer thereof.

The gate insulating film of MISFET in the region A can be constituted as a laminate film formed by stacking two layers of the high dielectric constant insulating films. However, the step between the region A and region B is increased in this case, and particularly, when a step of 20 nm or more is formed, this causes disadvantages, for example, in the subsequent gate electrode forming step or the connection hole forming step.

When compared with a case of constituting the gate insulating film 12 in the region A only with the silicon oxide film, since the thickness of the silicon oxide film 9 can be reduced, oxidation in the inside of the device isolation trench 4a can be reduced to decrease the stress at the end of the device isolation trench 4a.

(Second Embodiment)

In the first embodiment, while the high dielectric constant insulating film 10 and the like are etched by using the sidewalls 18 and the gate electrodes 13n and 13p as a mask, the high dielectric constant insulating film 10 may also be etched by using only the gate electrodes as a mask before forming the sidewalls 18.

A method of producing a semiconductor integrated circuit device as the second embodiment according to this invention is to be explained with reference to the cross sectional views for the principal portion of a semiconductor substrate shown in FIG. 37 to FIG. 46 in order of steps. Since the process up to the step of removing the silicon oxide film 14 is identical to the case of the first embodiment that has been explained with reference to FIG. 1 to FIG. 19, detailed explanations thereof will be omitted.

That is, a silicon oxide film 14 above gate electrodes 13n and 13p is etched under the condition where the etching selectivity of the silicon oxide film 14 relative to the high dielectric constant insulating film 10 (for example, 100 or more) becomes large. In other words, after the silicon oxide film 14 is removed in a state of leaving the high dielectric constant insulating film 10 on both ends of the gate electrodes 13n and 13p to expose the upper surface of the gate electrodes 13n and 13p (refer to FIG. 18 and FIG. 19), as shown in FIG. 37, the high dielectric constant insulating film 10 formed between the gate electrodes 13n and 13p is removed by, for example, sputter etching by using the electrodes as the mask.

Figure 37:
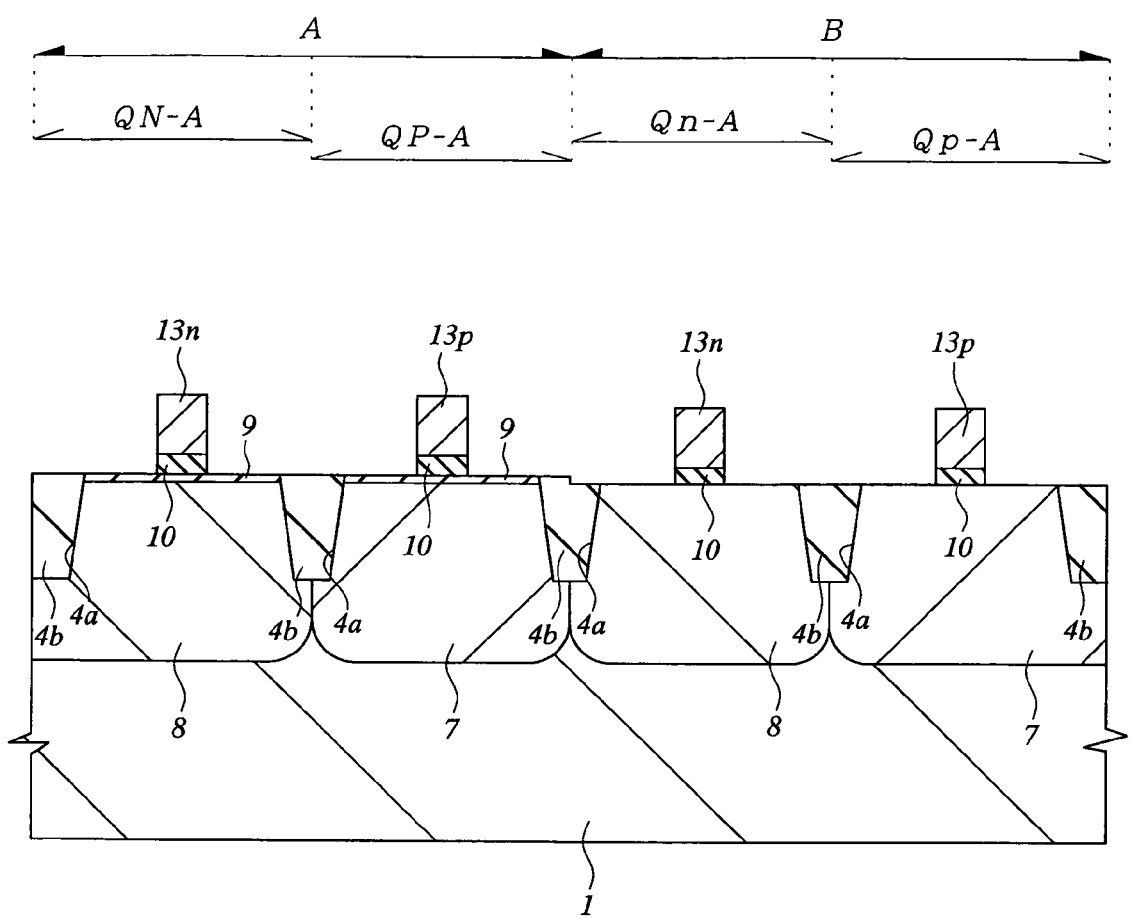
FIG. 37 to FIG. 46 are cross sectional views for a main portion of a substrate illustrating a method of producing a semiconductor integrated circuit device for illustrating the effect of the second embodiment according to the invention.
Figure 38:
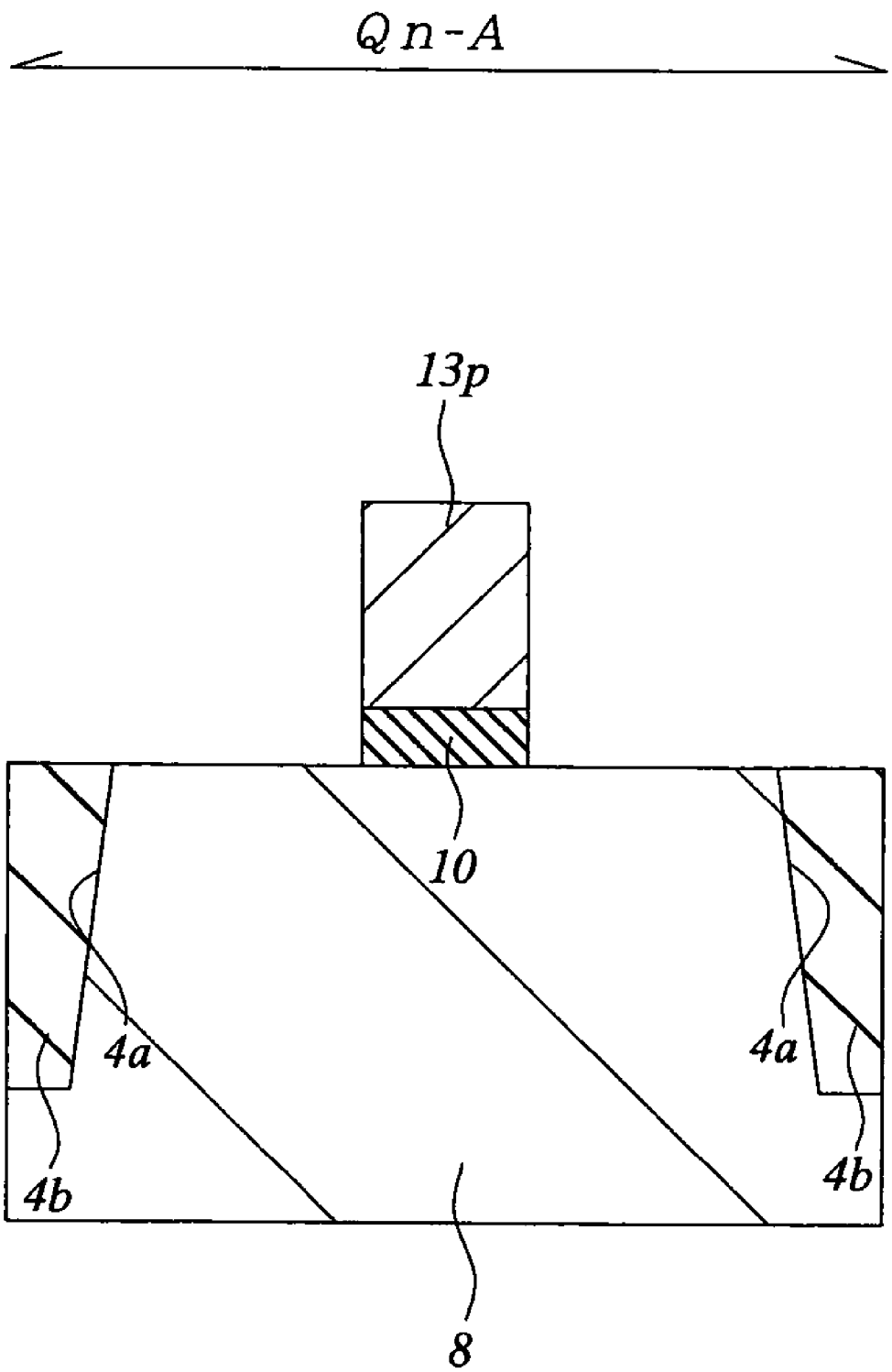

FIG. 38 shows a fragmentary enlarged view for an nMIS-forming region Qn-A in FIG. 37. As explained for the first embodiment, the high dielectric constant insulating film remains also below the end of the gate electrode 13, that is, the high dielectric constant insulating film extends as far as a portion below the end of the gate electrode 13 in this embodiment, and the voltage withdrawing can be improved. Further, the capacitance can be ensured.

Figure 39:
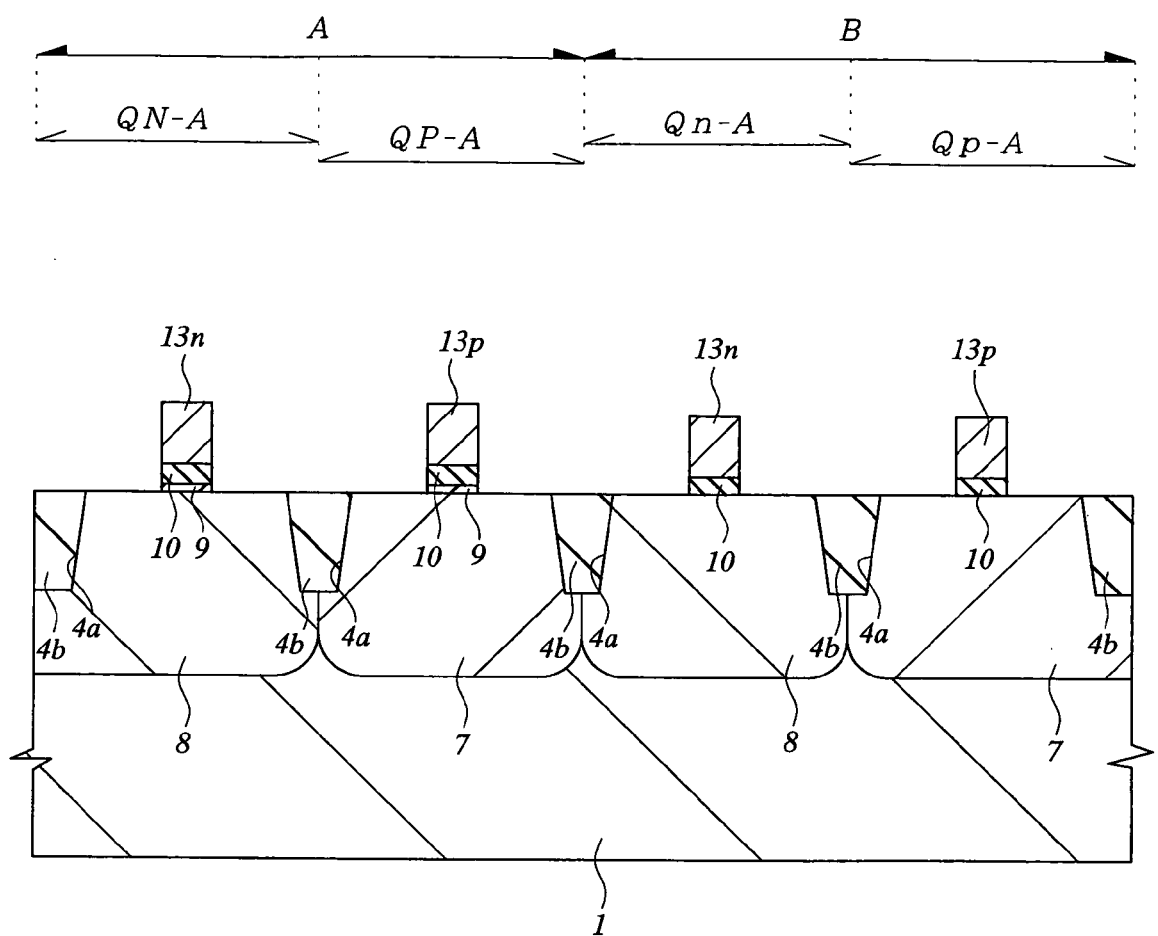
Figure 40:
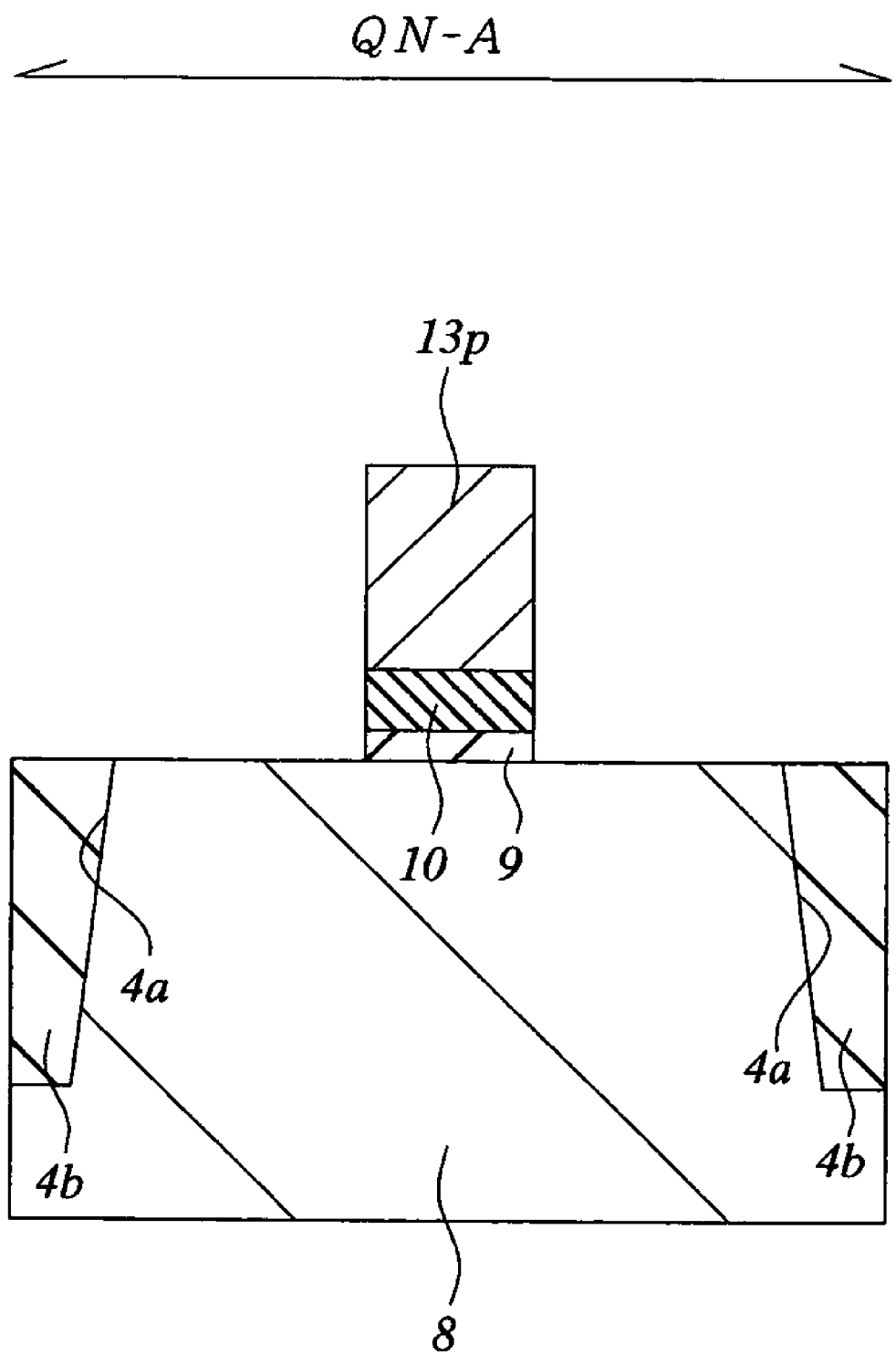

Successively, as shown in FIG. 39, a silicon oxide film 9 in the region A exposed between the gate electrodes 13n and 13p is removed by using the electrodes as the mask, for example, by the wet etching. Also in this case, etching is conducted under the condition where the etching selectivity of the silicon oxide film 9 relative to the high dielectric constant insulating film 10 becomes large. FIG. 40 shows a fragmentary enlarged view for the nMIS-forming region QN-A in FIG. 39.

Figure 41:
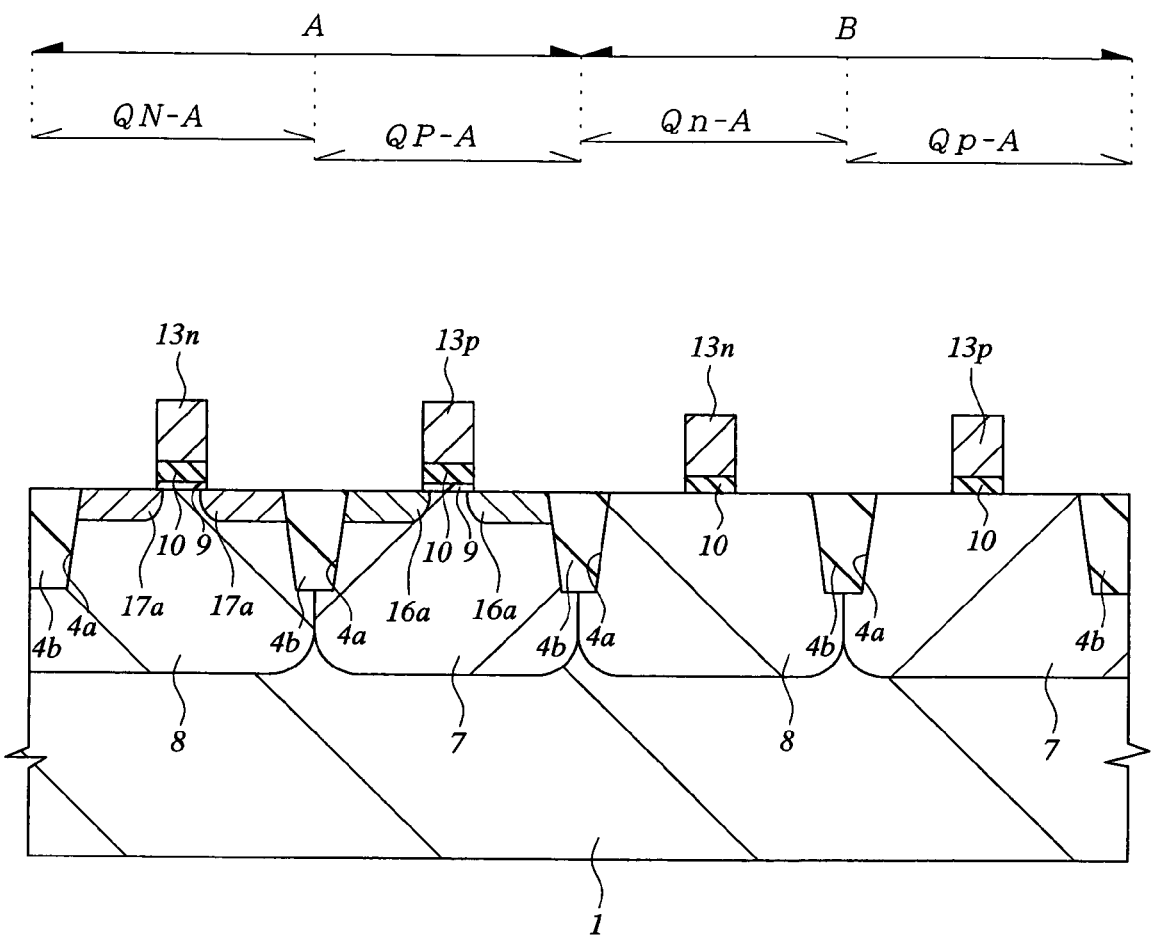

Then, as shown in FIG. 41, a p⁻-semiconductor region 16a is formed to the pMIS-forming region (QP-A) of the region A to form a Halo layer (not illustrated). Further, an n⁻-semiconductor region 17a is formed in the nMIS-forming region (QN-A) of the region A to form a Halo layer (not illustrated). Since the method of forming them (conduction type and concentration of impurity) is identical to the first embodiment, detailed explanations thereof will be omitted.

Figure 42:
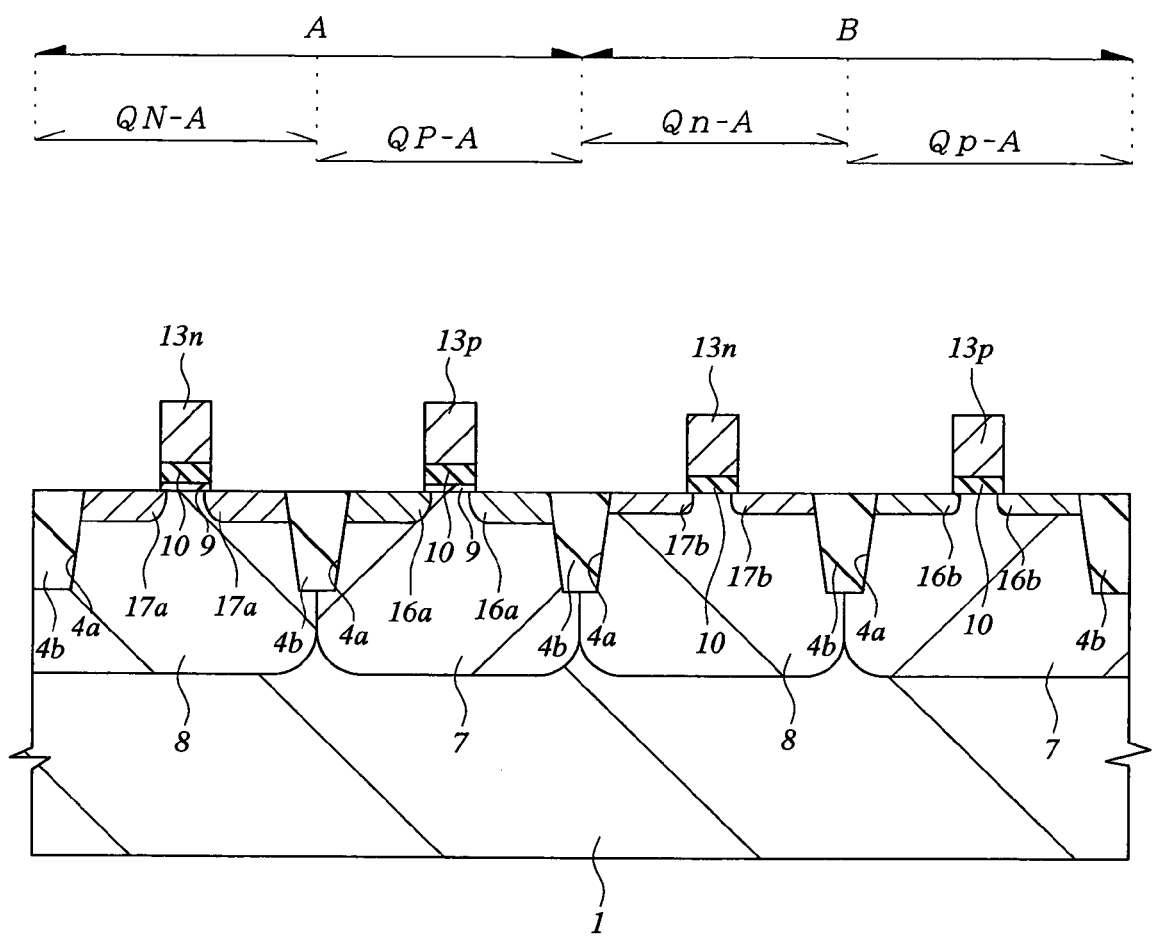

Then, as shown in FIG. 42, a p-extension region 16b is formed in the pMIS-forming region (Qp-A) of the region B to form a Halo layer (not illustrated). Further, an n-extension region 17b is formed in the nMIS-forming region (Qn-A) of the region B to form a Halo layer (not illustrated). Since the method of forming them (conduction type and concentration of impurity) is identical to the first embodiment, detailed explanations thereof will be omitted.

Then, in this embodiment, since the high dielectric constant insulating film 10 has been removed before implantation of the impurity constituting the semiconductor region, the extension region and the Halo layer, impurity implanting characteristic is improved.

That is, the distribution in the direction of the thickness (profile) of the impurity implanted into solid can be represented by the Gaussian distribution using the projection range (Rp) and the dispersion (ΔRp) obtained by the LSS theory.

On the other hand, when the high dielectric constant insulating film 10 remains, the implantation energy has to be increased. However, when the implantation energy is increased, the profile of the impurity is broadened. Accordingly, it is difficult to implant the impurity at a good controllability. Particularly, since it is necessary to form the semiconductor regions (16a, 17a) and the extension region (16n, 17b) in a shallow state, an impurity region of a desired profile can be obtained by previously removing the high dielectric constant insulating film. Since the silicon oxide film 9 is thin, the impurity may be ion implanted in a state of leaving the film. Since the high dielectric constant insulating film 10 is thick when compared with the silicon oxide film 9, a significant effect is obtained by removing the same.

Figure 43:
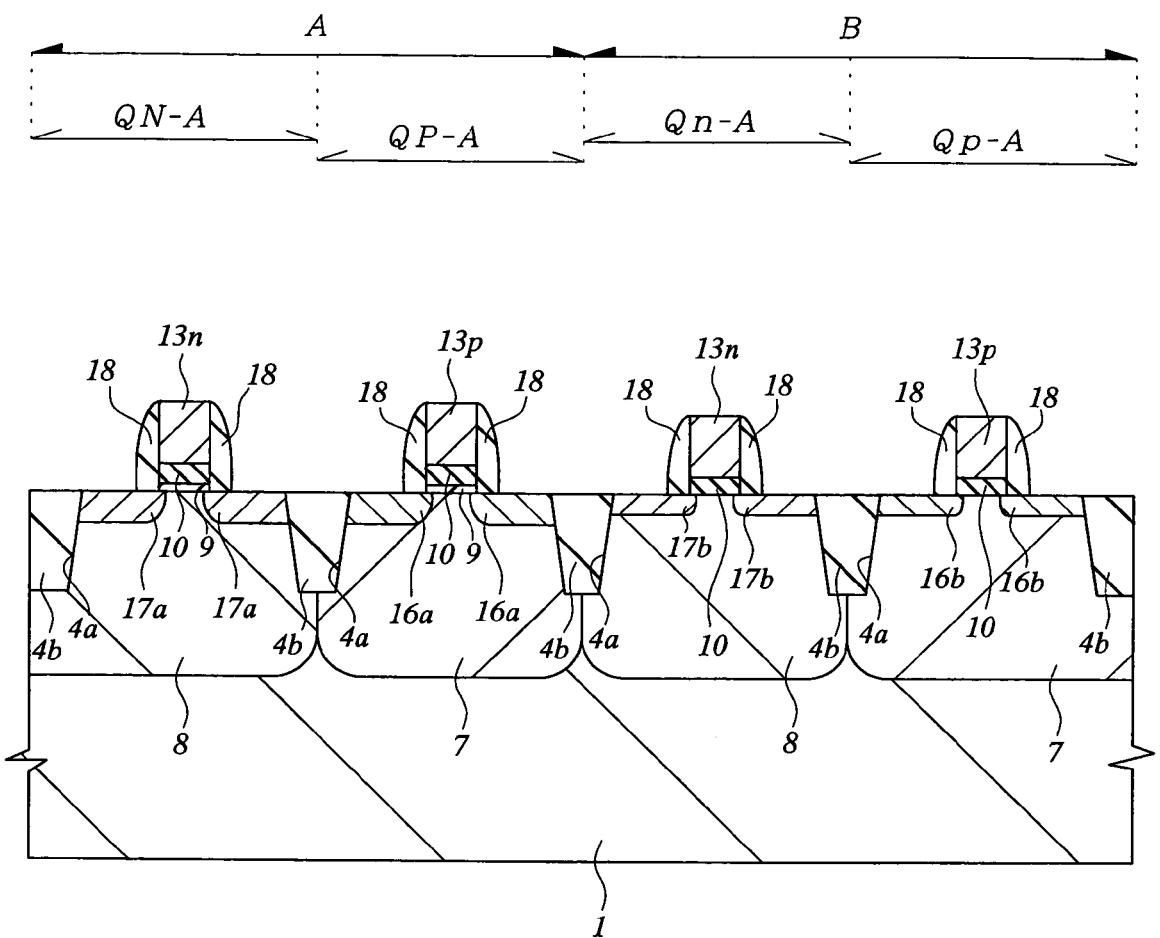

Then, as shown in FIG. 43, a silicon oxide film is deposited over the semiconductor substrate 1, and successively, the silicon oxide film is etched anisotropically, thereby forming sidewalls (sidewall films) 18 on the sidewalls of the gate electrodes 13n and 13p.

Figure 44:
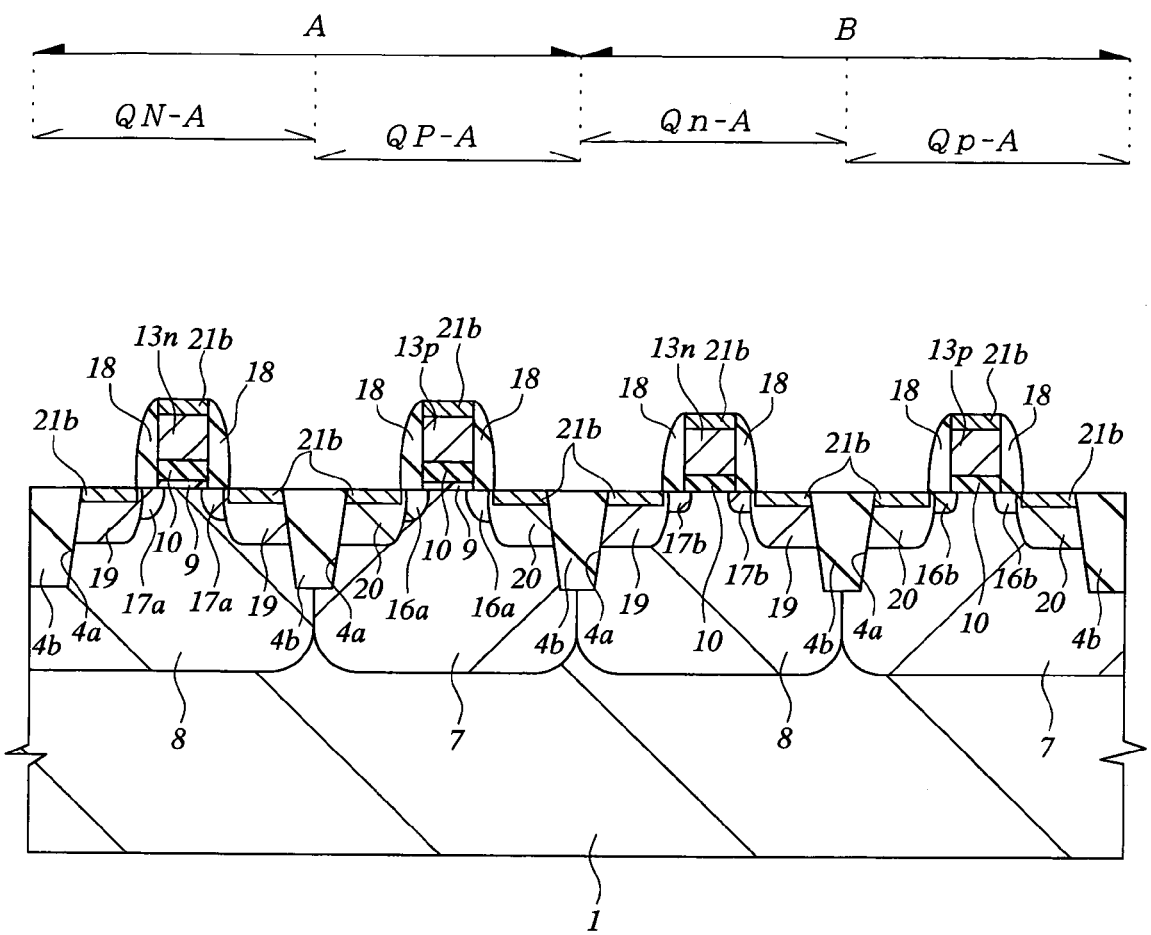

Then, as shown in FIG. 44, an n-impurity, for example, arsenic is ion implanted to p-wells 8 in the nMIS-forming regions (QN-A, Qn-A) of the regions A and B to form an n⁺-semiconductor regions 19 to the p-wells 8 on both sides of the gate electrode 13n. Then, p-impurity, for example, boron fluoride is ion implanted to n-wells 7 in the pMIS-forming regions (QP-A, Qp-A) of the regions A and B to form a p⁺-semiconductor regions 20 to the n-wells 7 on both sides of the gate electrode 13p. The semiconductor regions are formed in self alignment with the gate electrodes 13n and 13p and the sidewalls 18 and function as the source and drain for the MISFET. Further, while each of the impurities is implanted also to the gate electrode, since the impurities in the source and drain and the gate electrode of each MIS are of an identical conduction type, implantation of impurity causes no problem and can compensate the impurity, if insufficient in the gate electrode.

Then, in the same manner as the first embodiment, a high melting metal film 21a, for example, a cobalt film is deposited over the semiconductor substrate 1. Then, a heat treatment at about 500 to 600° C. is applied to the semiconductor substrate 1 to form a silicide layer 21b on the upper surface of the gate electrodes 13n and 13p, and the surface of the $n^+$-semiconductor region 19 and the $p^+$-semiconductor region 20 (source and drain regions) selectively. Subsequently, unreacted cobalt film 21a is removed and then a heat treatment is applied for lowering the resistance of the silicide layer 21b (FIG. 44).

Figure 45:
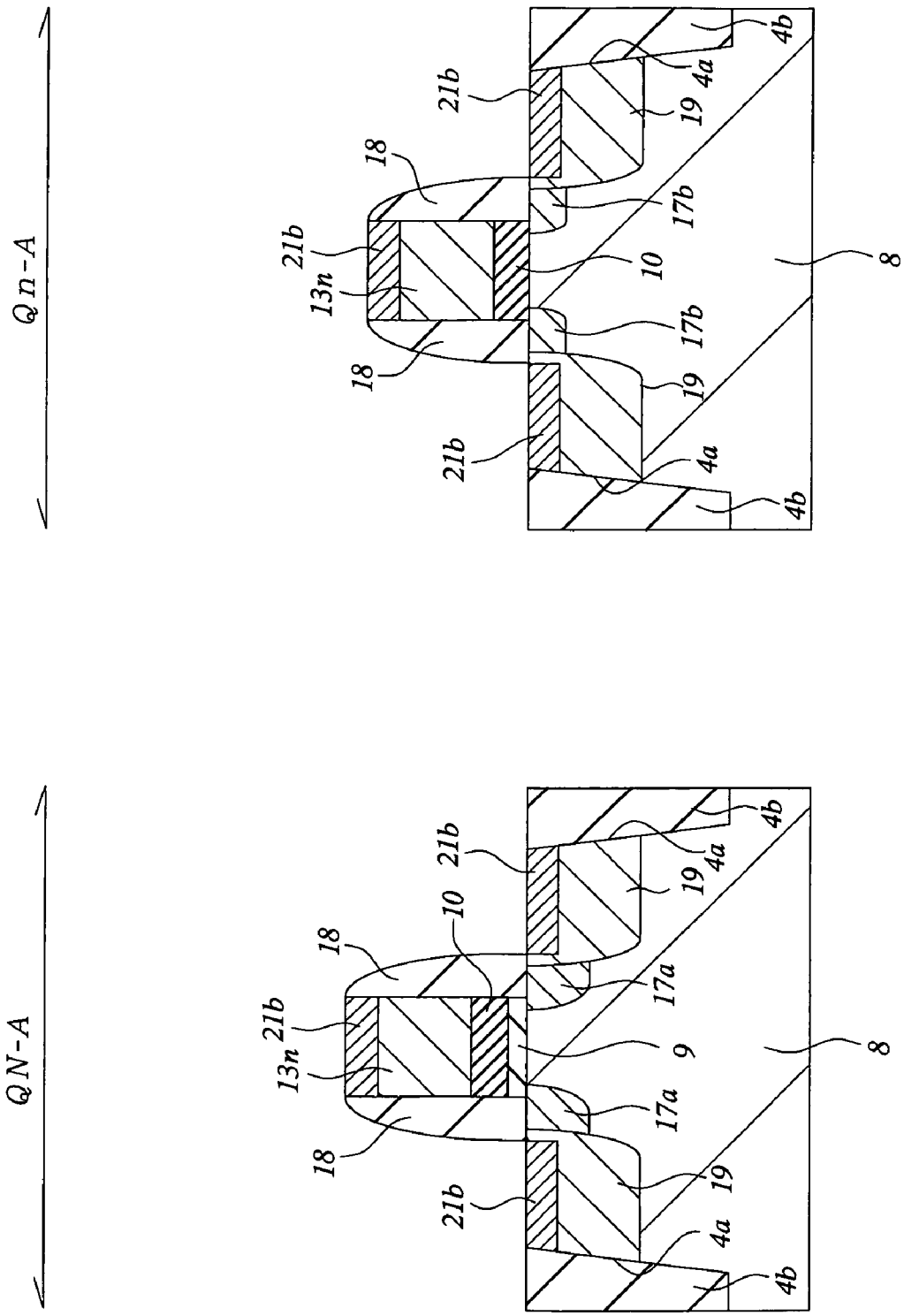

FIG. 45 shows an enlarged fragmentary view for nMIS-forming regions QN-A and Qn-A in FIG. 44. As illustrated, also in this embodiment, the pit (110) described previously with reference to FIG. 35 is not formed, and the high dielectric constant insulating film 10 remains also to a portion below the end of the gate electrodes 13n and 13p. In other words, the high dielectric constant insulating film 10 extends as far as a portion below the end of the gate electrodes 13n and 13p, which can improve the voltage withstand. Further, the capacitance can be ensured.

Figure 46:
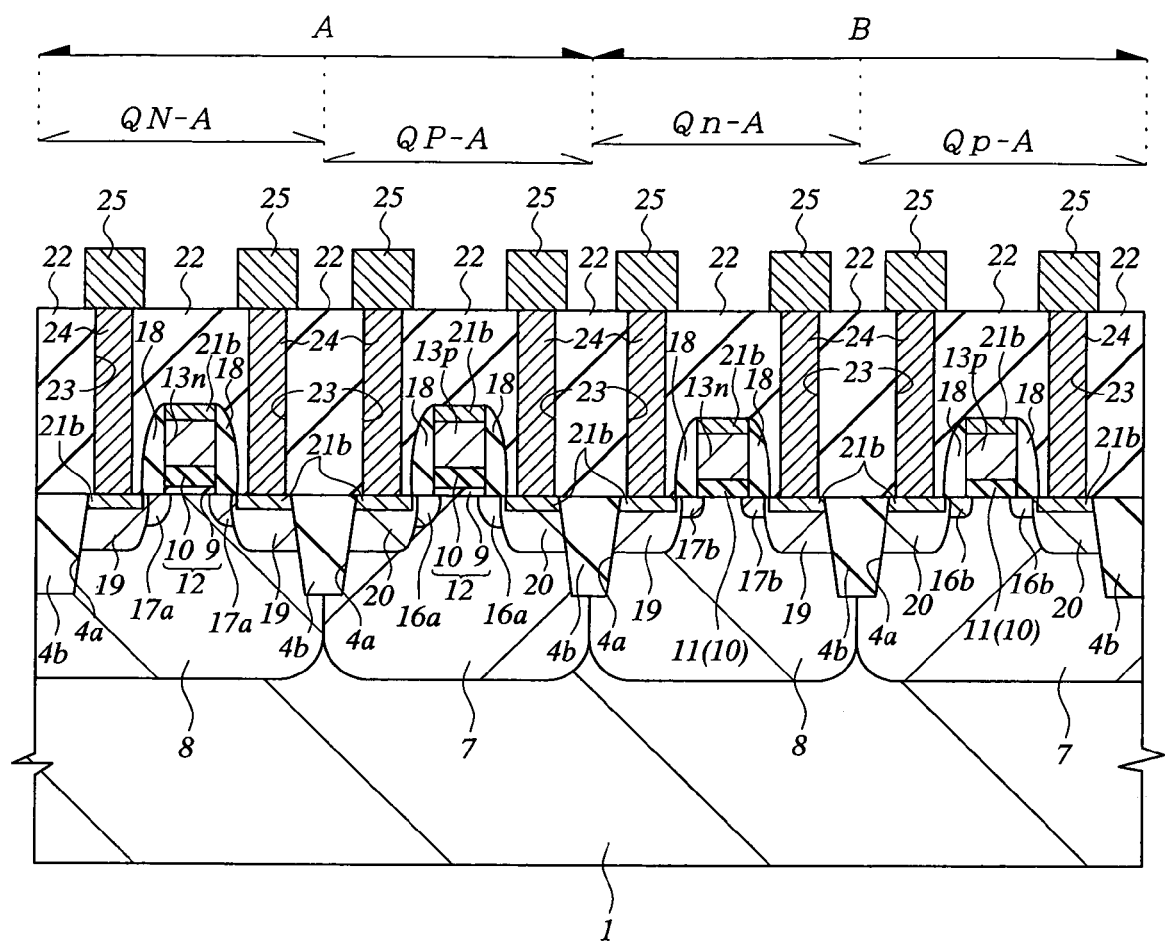

Then, in the same manner as in the first embodiment, a TEOS film is formed as a silicon oxide film 22 over the semiconductor substrate 1 and connection holes 23 are formed in the film. Further, plugs 24 are formed in the connection holes 23. Further, wirings 25 for the first wiring layer are formed on the plugs 24 (FIG. 46).

Subsequently, after forming the upper layer wirings, the semiconductor substrate 1 is further covered for the entire surface by a passivation film to substantially complete a semiconductor integrated circuit device as the second embodiment according to the invention.

The invention made by the inventors of the present invention has been described specifically based on the embodiments of the invention but it will be apparent that the invention is not restricted to the embodiments but may be modified variously within the range not departing from the gist of the invention.

For example, while the embodiments described above have been explained with reference to the example of MISFET, the invention is applicable generally to those semiconductor devices having a high dielectric constant insulating film as a gate insulating film (for example, non-volatile memory and ferroelectric memory).

Advantageous effects capable of obtaining by typical examples among those disclosed in the present application are briefly explained as below.

Since the conductive film on the high dielectric constant insulating film is etched by using a pattern comprising the insulating film thereon as a mask thereby forming a conductor piece and then the pattern comprising the insulating film is etched under the condition where the etching selectivity of the insulating film relative to that of the high dielectric constant insulating film becomes large, for example, at a selectivity of 100 or more, it is possible to improve the characteristics of the semiconductor integrated circuit device having MISFET using the high dielectric constant insulating film as the gate insulating film.

Further, since the pattern comprising the insulating film is removed to expose the upper surface of the conductor piece after forming the conductor piece and in a state of leaving the high dielectric constant film on both ends of the conductor piece, it is possible to improve the characteristics of the semiconductor integrated circuit device having MISFET using the high dielectric constant insulating film as the gate insulating film.

Further, since the high dielectric constant insulating film is extended as far as a portion below the end of the conductor piece of MISFET having the conductor piece formed over the semiconductor substrate via the high dielectric constant insulating film, it is possible to improve the characteristics of the semiconductor integrated circuit device having such MISFET.

INDUSTRIAL APPLICABILITY

As described above, this invention is a technique which is generally applicable to those semiconductor devices having a high dielectric constant insulating film as a gate insulating film such as MISFET used for logic circuits or memories and which is particularly effective when applied to apparatus or equipment having the devices described above.

The invention claimed is:

1. A method of producing a semiconductor integrated circuit device, comprising the steps of:
   (a) forming a high dielectric constant insulating film over a semiconductor substrate;
   (b) forming a conductive film over the high dielectric constant insulating film;
   (c) forming a mask film over the conductive film;
   (d) selectively removing the mask film thereby forming a mask pattern;
   (e) etching the conductive film by using the mask film having the mask pattern as a mask thereby forming a conductor piece;
   (f) removing the mask film in a state of leaving the high dielectric constant insulating film on both ends of the conductor piece over the semiconductor substrate;
   (g) after the step (f), removing the high dielectric constant insulating film on both ends of the conductor piece over the semiconductor substrate;
   (h) after the step (g), forming semiconductor regions in the semiconductor substrate; and
   (i) after the step (h), forming side wall on side surfaces of the conductor piece by depositing an insulating film and anisotropically etching the insulating film.

2. A method of producing a semiconductor integrated circuit device according to claim 1,
   wherein the conductive film is a silicon film and the mask film is a silicon oxide film.

3. A method of producing a semiconductor integrated circuit device according to claim 1, further comprising the step of:
   j) after the step (i), depositing a metal film over the conductor piece and forming a reaction layer at a portion of contact between the conductor piece and the metal film,
   wherein the conductive film is a silicon film and the reaction layer is a silicide film.

4. A method of producing a semiconductor integrated circuit device according to claim 1,
   wherein the high dielectric constant insulating film is a film having a specific dielectric constant of 2.0 or more.

5. A method of producing a semiconductor integrated circuit device according to claim 1, further comprising the step of:

(h) before the step (a), forming a trench in the semiconductor region by etching the semiconductor substrate and forming another insulating film in the trench, wherein the high dielectric constant insulating film has a higher specific dielectric constant than that of another insulating film.

6. A method of producing a semiconductor integrated circuit device according to claim 1, wherein the high dielectric constant insulating film comprises an alumina film, a titanium oxide film, a zirconium oxide film, a hafnium oxide film, a tantalum oxide film, or a ruthenium oxide film.

7. A method of producing a semiconductor integrated circuit device according to claim 1, wherein, in the step (g), the high dielectric constant insulating film is removed by using the conductor piece as a mask, under the condition where the etching selectivity of the high dielectric constant insulating film relative to the conductor piece becomes large.

8. A method of manufacturing a semiconductor integrated circuit device, comprising the steps of:

(a) providing a semiconductor substrate with a first insulating film formed over a first region of the semiconductor substrate and a second insulating film formed over a second region of the semiconductor substrate wherein a thickness of the first insulating film is greater than a thickness of the second insulating film;

(b) forming a high dielectric constant insulating film over the first insulating film and over the second insulating film;

(c) forming a conductive film over the high dielectric constant insulating film;

(d) forming a mask film over the conductive film;

(e) selectively removing the mask film thereby forming a mask pattern;

(f) etching the conductive film by using the mask film having the mask pattern as a mask thereby forming conductor pieces over the first region and over the second regions;

(g) removing the mask film in a state of leaving the high dielectric constant insulating film on both ends of the conductor pieces over the first region and over the second region;

(h) after the step (g), removing the high dielectric constant insulating film on both ends of the conductor pieces over the first region and over the second region;

(i) after the step (h), forming first semiconductor regions in the first region and forming second semiconductor regions in the second region; and (j) after the step (i), forming side walls on side surfaces of the conductor pieces by depositing an insulating film and anisotropically etching the insulating film.

9. A method of producing a semiconductor integrated circuit device according to claim 8, wherein the conductive film is a silicon film and the mask film is a silicon oxide film.

10. A method of producing a semiconductor integrated circuit device according to claim 8, further comprising the steps of:

(k) after the step (i), depositing a metal film over the conductor pieces and forming reaction layers at portions of contact between the conductor pieces and the metal film, wherein the conductive film is a silicon film and the reaction layer is a suicide film.

11. A method of producing a semiconductor integrated circuit device according to claim 8, wherein the first insulating film is a silicon oxide film, the second insulating film is a silicon oxide film and the high dielectric constant insulating film is a film having a specific dielectric constant of 2.0 or more.

12. A method of producing a semiconductor integrated circuit device according to claim 8, wherein the high dielectric constant insulating film comprises an alumina film, a titanium oxide film, a zirconium oxide film, a hafnium oxide film, a tantalum oxide film, or a ruthenium oxide film.

13. A method of producing a semiconductor integrated circuit device according to claim 8, wherein, in the step (h), the high dielectric constant insulating film is removed by using the conductor piece as a mask, under the condition where the etching selectivity of the high dielectric constant insulating film relative to the conductor piece becomes large.

14. A method of producing a semiconductor integrated circuit device according to claim 1, wherein in the step (f), etching is performed under the condition where the etching selectivity of the mask film relative to the high dielectric constant insulating film is large, thereby removing the mask to expose the upper surface of the conductor piece in a state of leaving the high dielectric constant insulating film on both ends of the conductor piece over the semiconductor substrate.

15. A method of producing a semiconductor integrated circuit device according to claim 8, wherein, in the step (g), etching is performed under the condition where the etching selectivity of the mask film relative to the high dielectric constant insulating film is large, thereby removing the mask to expose the upper surfaces of the conductor pieces in a state of leaving the high dielectric constant insulating film on both ends of the conductor pieces over the first region and over the second region.

16. A method of producing a semiconductor integrated circuit device according to claim 1, wherein the side walls are formed on side surfaces of the high dielectric constant insulating film.

17. A method of producing a semiconductor integrated circuit device according to claim 8, wherein the side walls are formed on side surfaces the high dielectric constant insulating film at the first region and at the second region.

* * * * *